(12) United States Patent
Yoshizawa et al.

(10) Patent No.: US 6,973,395 B2
(45) Date of Patent: Dec. 6, 2005

(54) OBSERVATION AND/OR FAILURE INSPECTION APPARATUS, METHOD AND PROGRAM THEREFOR

(75) Inventors: Yutaka Yoshizawa, Kanagawa (JP); Kazuhiro Sakaguchi, Kanagawa (JP)

(73) Assignee: NEC Electronics Corporation, Kanagawa (JP)

(*) Notice: Subject to any disclaimer, the term of this patent is extended or adjusted under 35 U.S.C. 154(b) by 168 days.

(21) Appl. No.: 10/636,860

(22) Filed: Aug. 7, 2003

(65) Prior Publication Data

US 2004/0034490 A1    Feb. 19, 2004

(30) Foreign Application Priority Data

Aug. 13, 2002 (JP) .............................. 2002-235952

(51) Int. Cl.[7] .............................................. G06F 19/00
(52) U.S. Cl. ............................................ 702/76; 714/1
(58) Field of Search ............................. 702/76, 60, 64, 702/65, 182–185, 188, 189; 714/1, 25; 324/500

(56) References Cited

U.S. PATENT DOCUMENTS 5,301,122 A * 4/1994 Halpern ....................... 702/62

* cited by examiner

*Primary Examiner*—Carol S. W. Tsai
*Assistant Examiner*—Edward Raymond
(74) *Attorney, Agent, or Firm*—Darryl G. Walker; Bradley T. Sako

(57) ABSTRACT

An observation apparatus according to one embodiment can include a timing generating unit (2) that generates a timing signal at a predetermined period. A sampling unit (3) can sample a current observation signal of a power supply current on the basis of the timing signal, and store sampled data in data storing unit (5). A data number adjusting unit (6) can adjust the number of data samples to a number that is a power of two. An arithmetic operating unit (4) can Fourier-transform the adjusted data to generate frequency spectrum results of the current observation signal. In addition, a failure inspection apparatus according to one embodiment analyzes the frequency spectrum of an integrated circuit under observation to determine a failure condition of the integrated circuit.

20 Claims, 11 Drawing Sheets

US 6,973,395 B2

OBSERVATION AND/OR FAILURE INSPECTION APPARATUS, METHOD AND PROGRAM THEREFOR

TECHNICAL FIELD

The present invention relates to devices, methods, and a program for observing a frequency spectrum of a power supply current and devices, methods and programs for observing the frequency spectrum of a power supply current for an integrated circuit under test.

BACKGROUND OF THE INVENTION

Heretofore, a technique for detecting the failure of an integrated circuit has been proposed that is based on analyzing the frequency of a power supply current that flows through an integrated circuit under test. In this technique, when the integrated circuit being observed is defective, a resulting spectrum of a power supply current can be abnormal, indicating the failure or defect.

In a conventional method for observing a power supply for an abnormal current, a series of test signals can be applied in a continuous, repeated fashion, to a semiconductor integrated circuit under test (or DUT: Device Under Test). A resulting current that flows through the DUT is observed to detect a failure. An abnormal current can be detected by comparing the frequency spectrum of the power supply current caused to flow through the DUT with a predetermined frequency spectrum (e.g., a normal frequency spectrum). Such an abnormal current can indicate a failure in the DUT.

A conventional failure inspection apparatus and method will now be described with reference to FIG. 12 and FIG. 13 (refer to Japanese Patent No. 3085284 B, herein after JP 3085284). As shown in FIG. 12, a conventional failure detection apparatus is shown to include a control means 1001, timing generating means 1002, sampling means 1003, arithmetic operation means 1004, and data storing means 1005.

The timing generating means 1002 can generate a timing signal at a constant period. The control means 1001 generates indications for the starting and ending of a data sampling operation based on the timing signal. Such a data sampling operation can sample the data of a current observation signal.

Upon receiving a start indication for a sampling operation, a sampling means 1003 can start sampling a current observation signal. In addition, upon receiving an end indication for a sampling operation, a sampling means 1003 can end the sampling of the current observation signal. Sampled data can be successively transmitted to data storing means 1005, and stored therein.

After generating an end indication, the control means 1001 can issue an arithmetic operation instruction to arithmetic operation means 1004. Upon reception of the arithmetic operation instruction from the control means 1001, the arithmetic operation means 1004 reads out the sampling data from the data storing means 1005 to execute a discrete Fourier transform analysis on the results. The data storing means 1005 outputs the analysis results.

FIG. 13 is a flow chart showing a processing flow for a conventional method of observing a power supply current frequency spectrum. A conventional method of inspecting a power supply current spectrum will now be described with reference to FIG. 13. In such a method, the timing generation means 1002 generates a timing signal having a predetermined period (i.e., at the period of the application of a test signal) (S1101).

Upon reception of the timing signal from the timing generating means 1002, the control means 1001 generates the indication for starting the sampling of a current observation signal of the power supply current. The sampling means 1003 starts the sampling of the current observation signal according to such a start indication from the control means (S1102). At this time, sampling is carried out at predetermined, constant intervals. In addition, the sampled data is successively sent to data storing means 1005 to be stored and held therein.

Upon sampling the current observation signal, the control means 1001 generates the indication for ending the sampling of the current observation signal. Sampling means 1003 ends the sampling of the current observation signal according to an indication for ending the sampling (S1103).

After the generation of the indication for ending sampling, the control means 1001 issues an arithmetic operation instruction to the arithmetic operation means 1004. The arithmetic operation means 1004 reads out data obtained by sampling the current observation signal from the data storing means 1005, and executes the discrete Fourier transform (DFT) (S1105). Results obtained from the arithmetic operation means 1004 correspond to the magnitude of predetermined frequency components of the current observation signal, and are outputted as results (S1106).

However, in such a conventional method, the number of data samples can be indefinite as such a number depends on the overall current observation time and sampling period. That is, the number of data samples is obtained by dividing the sample period by a sampling rate (sampling period/sample rate).

Moreover, in the case where discrete Fourier transform (DFT) is used as the Fourier transform operation, if the number of data samples is N, the number of necessary arithmetic operations can be the square of N (for example, refer to "Transmission Circuits", by Shigeo Tsujii, edited by THE INSTITUTE OF ELECTRONICS AND COMMUNICATION ENGINEERS OF JAPAN, Corona Publishing Co., Ltd., $1^{st}$ Edition, 1983, p. 26). For this reason, as the number of data samples N is increased, the time required to execute the arithmetic operations for the discrete Fourier transform becomes larger in proportion to the square of N.

In this way, the number of sampling data is determined based on the current observation time and sampling period. Further, the time required to execute the discrete Fourier transform operation becomes inordinately longer in proportion to the square of N, where N is the number of data samples. Thus, if the number of data samples becomes large, the time required for execution of the arithmetic operation of the Fourier transform can be very long. As a result, the time required to observe the frequency spectrum of the power supply current can become long, and the observation of a power supply current spectrum cannot be efficiently carried out.

Furthermore, the arithmetic operation means 1004 executes the arithmetic operation using the discrete Fourier transform (DFT) or fast Fourier transform (FFT). In the case where the arithmetic operation is executed using the discrete Fourier transform (DFT), a problem arises in the large amount time required to execute the transform operation. In addition, while a concrete procedure for executing the fast Fourier transform (FFT) is not demonstrated in JP 3085284, in the case where the arithmetic operation is executed using the fast Fourier transform (FFT), the number of data samples needs to be a power of two. For this reasons, in a conventional failure inspection apparatus, in order to take advantage of the fast Fourier transform, sampling needs must be carried out until the number of data samples becomes a power of two. Consequently, sampling the frequency spectrum of a power supply current cannot be carried out in an efficient manner.

The above description and references have described a conventional observation apparatus and observation method, a conventional failure inspection apparatus and failure inspection method, and conventional program therefore. However, as described above, such conventional approaches can have the problem that observation of a power supply current frequency spectrum can be inefficient. Consequently, detecting a failure in an integrated circuit according to such a method may also be inefficient.

The present invention can address the above-mentioned problems. Therefore, it is an object of the present invention to provide an observation apparatus and observation method that can more efficiently observe a frequency spectrum of a power supply current than THE conventional approach. It is also an object of the present invention to provide a failure detection apparatus and a failure detection method that can more efficiently detect a failure in an integrated circuit under test. Still further, it is an object of the present invention to provide a program for execution on a computer, or the like, that can realize such an observation apparatus and/or method, and a failure detection apparatus and/or method.

SUMMARY OF THE INVENTION

The present invention can include an observation apparatus that includes a sampling unit that samples a current observation signal that corresponds to a power supply current, a data storing unit that stores a number of data samples sampled by the sampling unit, and a data number adjusting unit that adjusts the number of data samples sampled by the sampling unit. The observation apparatus may further include a control unit for controlling the data number adjusting unit to adjust the number of data samples to an adjusted number. The adjusted number can be a power of a predetermined integer that is greater than one if the number of data samples is not a power of the predetermined integer. At least one arithmetic operation unit can perform arithmetic operations on the adjusted number of data samples to generate frequency spectrum data for the adjusted number of data samples. Such an apparatus can carry out observation of a frequency spectrum of the power supply current in an efficient manner. In particular, adjusting a data sample number to be a power of a predetermined integer can allow for more efficient calculation of frequency spectrum terms.

According to one aspect of the embodiments, at least one arithmetic operation unit can generate decomposed frequency spectrum terms and perform repeated arithmetic operations on the adjusted number of data samples according sets, each set having a predetermined number of values.

According to another aspect of the embodiments, at least one arithmetic operation unit can execute first and second arithmetic operation processing. A first arithmetic operation processing can calculate data set values after decomposing frequency spectrum terms to serve as reference values for data sets. A second arithmetic operation processing can perform arithmetic operations on the adjusted number of data values based on data set values calculated by the first arithmetic operation processing, to thereby arrive a frequency spectrum results.

According to another aspect of the embodiments, a data number adjusting unit can adjust the number of data samples by: thinning out the number of data samples sampled by the sampling unit, or inserting data into the data samples sampled by the sampling unit. With such an arrangement, observation of the frequency spectrum of a power supply current may be efficiently carried out irrespective of sampling period or sampling rate. For example, even if a given sampling period and/or sampling rate results in a number of data values not necessarily conducive to rapid calculation of frequency terms, the number of data values may be adjusted to allow for rapid calculation of frequency terms.

According to another aspect of the embodiments, a data number adjusting unit can thin out the number of data samples or insert data into the data samples according to the storage addresses of the data samples stored in the data storing unit. With such an arrangement, a number of data values can be rapidly adjusted to a desired amount.

According to another aspect of the embodiments, a data number adjusting unit can select between thinning out the number of data samples or inserting data into the data samples according to the number of the number of data samples sampled by the sampling unit. With such an arrangement, the number of data samples can be adjusted rapidly and more efficiently. As but one example, a data thinning out or data insertion operation can be selected in order to minimize the number of steps for a given adjustment operation.

According to another aspect of the embodiments, at least one arithmetic operation unit generates frequency spectrum data according to a fast Fourier transform operation. In addition, the predetermined integer is two. With such an arrangement, the frequency spectrum of a power supply current can be rapidly generated.

According to another aspect of the embodiments, a sampling unit can be coupled to a current observation signal corresponding to an integrated circuit under test. The invention may further include a tester unit that can apply a test signal to the integrated circuit under test, and a frequency spectrum analyzing unit that analyzes the frequency spectrum data from at least on arithmetic operation unit. Such an analysis can determine the presence of a failure condition in the integrated circuit under test. In such an arrangement, the observation of a power supply current for an integrated circuit under observation can be readily carried out, allowing for rapid and/or more efficient detection of failures in such an integrated circuit.

The present invention may also include a method of observing the frequency spectrum of a power supply current observation signal of an integrated circuit under test. The method can include the steps of sampling the power supply current observation signal, storing the sampled data, and adjusting the number of sampled data to an adjusted number of sampled data. Such an adjusted number can be a power of a predetermined integer if the number of sampled data is not a power of the predetermined integer. The predetermined integer is greater than one. The method may further include arithmetically operating on the adjusted number of data samples to generate frequency spectrum data for the adjusted number of data samples. Such a method can observe a frequency spectrum of the power supply current in a more efficient manner. In particular, adjusting a data sample number to be a power of a predetermined integer can allow for more efficient calculation of frequency spectrum terms.

According to one aspect of the embodiments, a step of arithmetically operating on the adjusted number of data samples includes generating decomposed frequency spectrum terms and performing repeated arithmetic operations on the adjusted number of data samples according sets, each set having a predetermined number of values.

According to another aspect of the embodiments, the step of operating on the adjusted number of data samples can include first and second arithmetic operation processing sub steps. A first arithmetic operation processing sub step can include calculating data set values after decomposing frequency spectrum terms to serve as reference values for the data sets. A second arithmetic operation processing sub step can include performing arithmetic operations on the adjusted number of data values based on data set values calculated by the first arithmetic operation processing sub step.

According to another aspect of the embodiments, the step of adjusting the number of data samples adjusts a number of data samples according to the adjustment method selected from the group consisting of: thinning out the number of data samples sampled by the sampling unit and inserting data into the data samples sampled by the sampling unit. With such an arrangement, the method may observe the frequency spectrum of a power supply current in a more efficiently manner irrespective of sampling period or sampling rate. For example, even if a given sampling period and/or sampling rate results in a number of data values not necessarily conducive to rapid calculation of frequency terms, the number of data values may be adjusted to allow for rapid calculation of frequency terms.

According to another aspect of the embodiments, the step of adjusting the number of data samples can include thinning out the number of data samples or inserting data into the data samples based on the storage addresses of the stored data samples. With such an arrangement, a number of data values can be rapidly adjusted to a desired amount.

According to another aspect of the embodiments, the step of adjusting the number of data samples can select between thinning out the number of data samples or inserting data into the data samples according to the adjusted number of data samples. With such an arrangement, the number of data samples can be adjusted rapidly and more efficiently. As but one example, a thinning out or insertion operation can be selected in order to minimize the number of steps for a given adjustment operation.

According to another aspect of the embodiments, the step of adjusting the number of data samples includes a fast Fourier transform operation. Further, the predetermined integer is two. With such an arrangement, the frequency spectrum of a power supply current can be rapidly generated.

According to another aspect of the embodiments, the method may further include the steps of applying at least one test signal to the integrated circuit under test, and analyzing the frequency spectrum data to determine the presence of a failure condition in the integrated circuit under test. In such an arrangement, the observation of a power supply current for an integrated circuit under observation can be readily carried out, allowing for rapid and/or more efficient detection of failures in such an integrated circuit.

The present invention may also include a computer program embodied on a machine readable media for observing a frequency spectrum of an observation signal that observes a power supply current flowing through an integrated circuit under observation. The computer program may include a sampling means for controlling the sampling of the observation signal, a storing means for storing a number of data samples sampled in response to the sample means, and a data number adjusting means that adjusts the number of data samples to an adjusted number. The adjusted number is a power of a predetermined integer if the number of data samples is not a power of the predetermined integer. The predetermined integer is greater than one. The computer program further includes arithmetic operation means that performs arithmetic operations on the adjusted number of data samples to generate frequency spectrum data for the adjusted number of data samples. Such a computer program can result in more efficient observation of a frequency spectrum of the power supply current. In particular, adjusting a data sample number to be a power of a predetermined integer can allow for more efficient calculation of frequency spectrum terms.

According to one aspect of the embodiments, an arithmetic operation means can generate decomposed frequency spectrum terms and perform repeated arithmetic operations on the adjusted number of data samples according sets, each set having a predetermined number of values.

According to another aspect of the embodiments, an arithmetic operation means can include a first and second arithmetic operation processing means. A first arithmetic operation processing means can data set values after decomposing frequency spectrum terms to serve as reference values for the data sets. A second arithmetic operation processing means can perform arithmetic operations on the adjusted number of data values based on data set values calculated by the first arithmetic processing means.

According to another aspect of the embodiments, a data number adjusting means can select between thinning out the number of data samples and inserting data into the number of data samples according to predetermined criteria.

DETAILED DESCRIPTION OF THE EMBODIMENTS

Various embodiments of the present invention will now be described with reference to accompanying drawings. The embodiments described below include a first embodiment in which sampled data can be thinned out to arrive at sample data number that is a power of two. In a second embodiment, data may be inserted into sampled data to adjust the number of data samples to a power of two. In a third embodiment, sampled data may be thinned out or data inserted to sample data to adjust the number of data samples to a power of two.

Embodiment 1 of the Invention.

A first embodiment of the present invention (hereinafter Embodiment 1) will now be described. Embodiment 1 can include an observation apparatus for observing a frequency spectrum of a power supply current, in which data can be thinned out from sampled data to arrive at a sampled data number that is a power of two. In addition, in an observation apparatus of Embodiment 1, an arithmetic operation can be executed for a specific frequency and the magnitude of a higher harmonic component thereof with respect to a power supply current of an integrated circuit under test. Such an arithmetic operation can be a fast Fourier transform (FFT), and thus obtain such results at a high speed.

Figure 1:
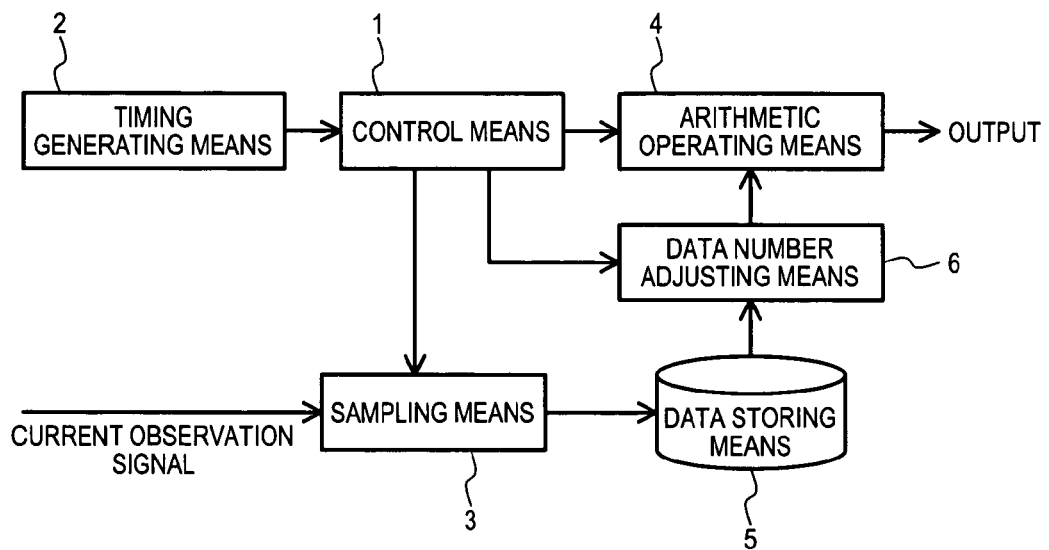
FIG. 1 is a block diagram showing one example of an observation apparatus according to a first embodiment (Embodiment 1) of the present invention.

An observation apparatus according to Embodiment 1 will now be described with reference to FIG. 1. FIG. 1 is a block diagram showing one example of an observation apparatus according to the present invention. As shown in FIG. 1, an observation apparatus can include, as main constituents, a timing generating means 2, a sampling means 3, a data storing means 5, data number adjusting means 6, an arithmetic operation means 4, and control means 1.

A timing generating means 2 can have the function of generating a timing signal at a constant period. A timing signal generated by timing signal generating means 2 can be output to control means 1. A sampling means 3 can have the function of carrying out data sampling for a current observation signal of a power supply current on the basis of a timing signal generated by timing generating means 2. Moreover, sampling means 3 can have the function of ending sampling of a current observation signal on the basis of such a timing signal. Data sampled by sampling means 3 can be output to data storing means 5.

A data storing means 5 can have the function of receiving and storing sampled data from sampling means 5. A data number adjusting means 6 can adjust a number of data samples provided to arithmetic operation means 4 to be a power of two. Thus, a fast Fourier transform (FFT) can be executed on such data. In addition, control means 1 can input an arithmetic operation instruction to arithmetic operation means 4. Such an instruction can instruct arithmetic operation means 4 to execute a Fourier transform operation according to the fast Fourier transform (FFT).

An observation apparatus according Embodiment 1 can be realized as a program executed by a computer to realize the above functions. In such an embodiment, programs for executing the functions are stored on a machine readable storage medium, and can be loaded by a computer in order to carry out the functions. In the form of a computer program, an Embodiment 1 can be made available for execution by distributed processing with hardware resources such as a computer, or the like. Alternatively, such a computer program may be a signal configuration available to a single computer, or the like.

Figure 2:
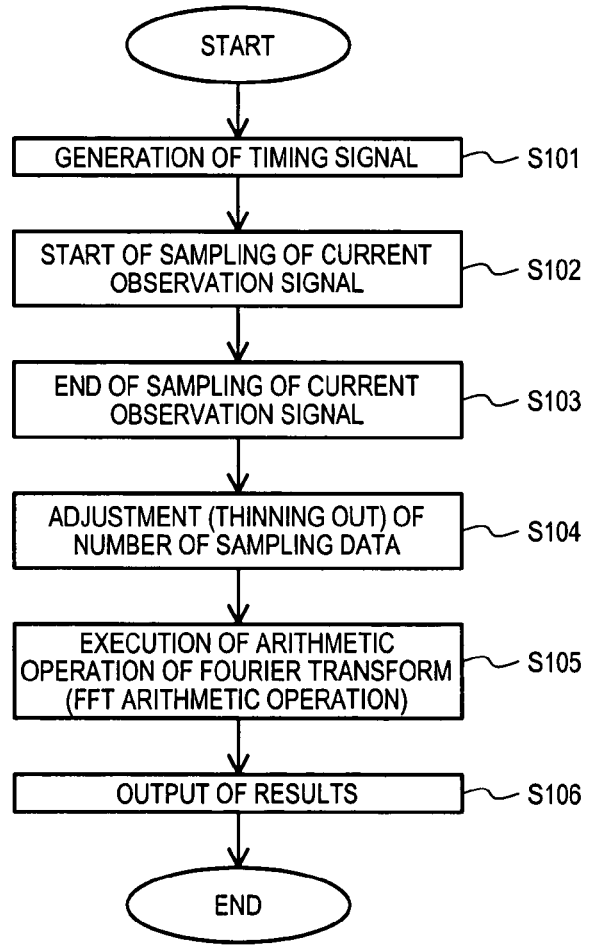
FIG. 2 is a flow diagram showing one example of a processing flow of an observation apparatus according to Embodiment 1 of the present invention.
Figure 3:
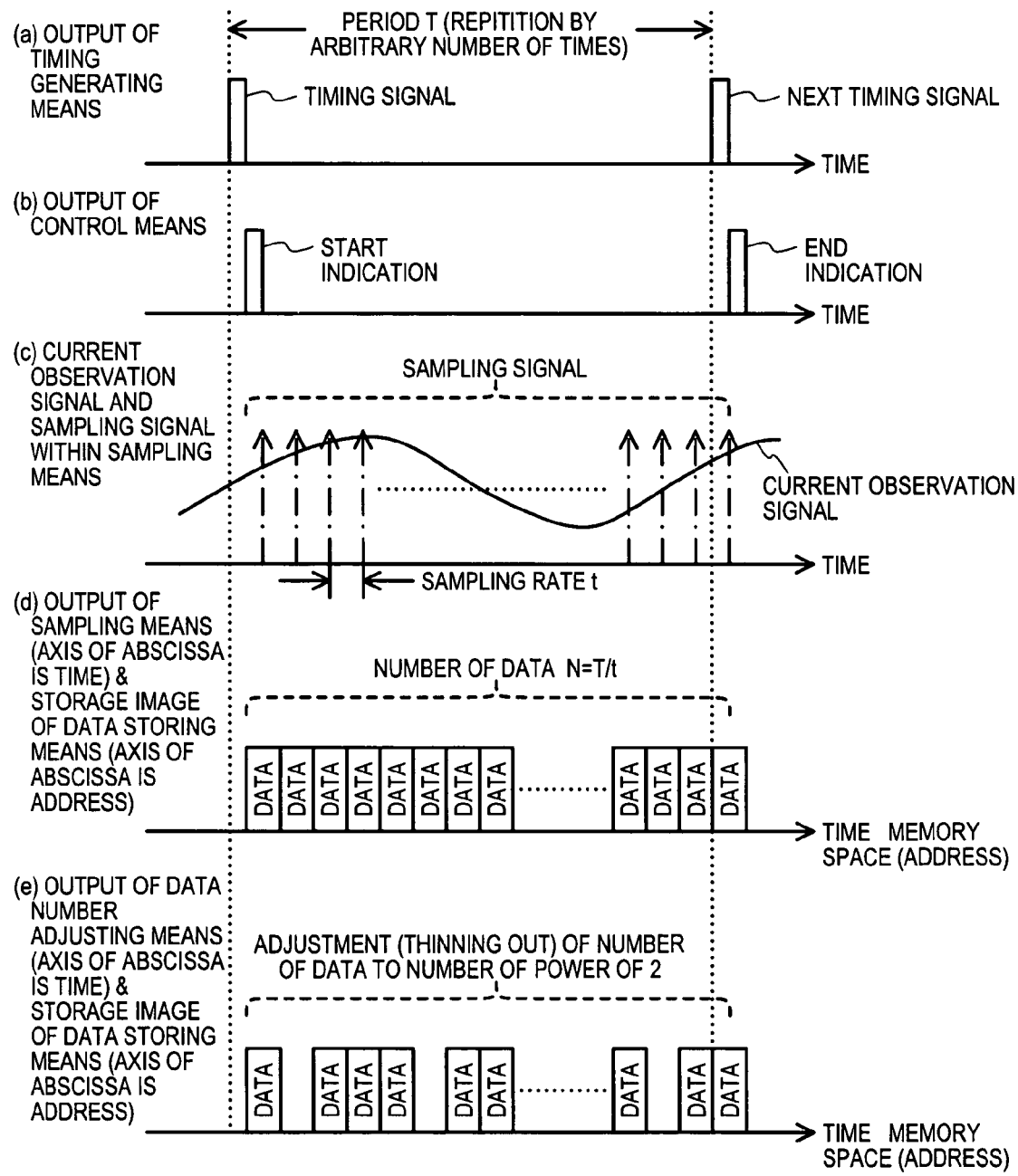
FIG. 3 is a timing diagram and memory space schematic diagram showing the operation of an observation apparatus according to Embodiment 1 of the present invention.

Next, an example of the operation of an observation apparatus according to Embodiment 1 will be described with reference to FIGS. 2 and 3. FIG. 2 is a flow chart showing one processing flow in an observation apparatus of Embodiment 1. FIG. 3 is a timing diagram with an accompanying schematic diagram showing the operation of an observation apparatus of Embodiment 1. More particularly, the axes of abscissa for FIG. 3(d) and FIG. 3(e) show both time and memory address of a memory space (e.g., a memory space within data storing means 5).

Timing generating means 2 can generate a timing signal (step S101 of FIG. 2). As shown in FIG. 3(a), a timing generating means 2 can generate a timing signal having a predetermined period T, and output such a timing signal to control means 1. As shown in FIG. 3(b), upon reception of the timing signal, control means 1 can output an indication for starting a sampling by sampling means 3. As shown in FIG. 3(c), upon receiving an indication to start signal sampling, sampling means 3 can start the sampling of a current observation signal at a predetermined sampling rate (step S102 of FIG. 2).

Then, following a period of time T, timing generating means 2 can generate another timing signal. As shown in FIG. 3(a), this timing signal can be a next timing signal following the previous timings signal corresponding to the "start" sampling indication. As shown in FIG. 3(b), upon reception of such a next timing signal, control means 1 can output an indication for ending sampling to sampling means 3. As shown in FIG. 3(c), upon receiving an indication to end signal sampling, sampling means 3 can end sampling of the current observation signal (step S103 of FIG. 2).

As shown in FIG. 3(d), data sampled by sampling means 3 can be output to a data storing means 5, and may be temporarily stored therein. At this time, sampling data can be stored in an ascending order beginning with a first storage address (e.g., "0") as a start of an address range. A number of stored data samples can depend upon sampling period "T", at which timing signal (e.g., FIG. 3(a)) is generated, and a sampling rate time "t". In such an arrangement, a number of data samples can correspond to the relationship T/t (omitting a remainder).

When sampling data has been temporarily stored in data storage means 5, control means 1 can issue an operation instruction to data number adjusting means 6. Such an operation instruction can be a data number adjustment instruction that instructs data number adjusting means 6 to adjust a number of sampled data. In this way, data number adjusting means 6 can adjust the number of data samples from those stored in data storing means 5 (step S104 in FIG. 2). In particular, data number adjusting means 6 can adjust the number of data samples to a number that is a power of two. Such an operation can ensure that sampled data can be subject to a Fourier transform operation according to the fast Fourier transform (FFT).

In an observation apparatus according to Embodiment 1, as shown in FIG. 3(e), a data number adjusting means 6 can thin out data stored in data storing means 5 to thereby adjust the number of data samples. For example, assuming that the number of data samples is N, a data number adjusting means 6 can thin out this data to adjust the number of data samples to be a power of two that does not exceed the number N (here, a resulting power-of-two number will be identified as Ma). After adjusting the number of data samples, data number adjusting means 6 can output such adjusted data samples to arithmetic operation means 4.

After a data number adjusting means 6 has adjusted a number of data samples, a control means 1 can issue an arithmetic operation start instruction to arithmetic operation means 4. In response to such an instruction, arithmetic operation means 4 can read out adjusted data samples and execute fast Fourier transform (FFT) operations thereon (step S105 in FIG. 2). Thereafter, arithmetic operation means 4 can output results of the arithmetic operation to a display portion, or the like, of the observation apparatus concerned (step S106 in FIG. 2).

Figure 4:
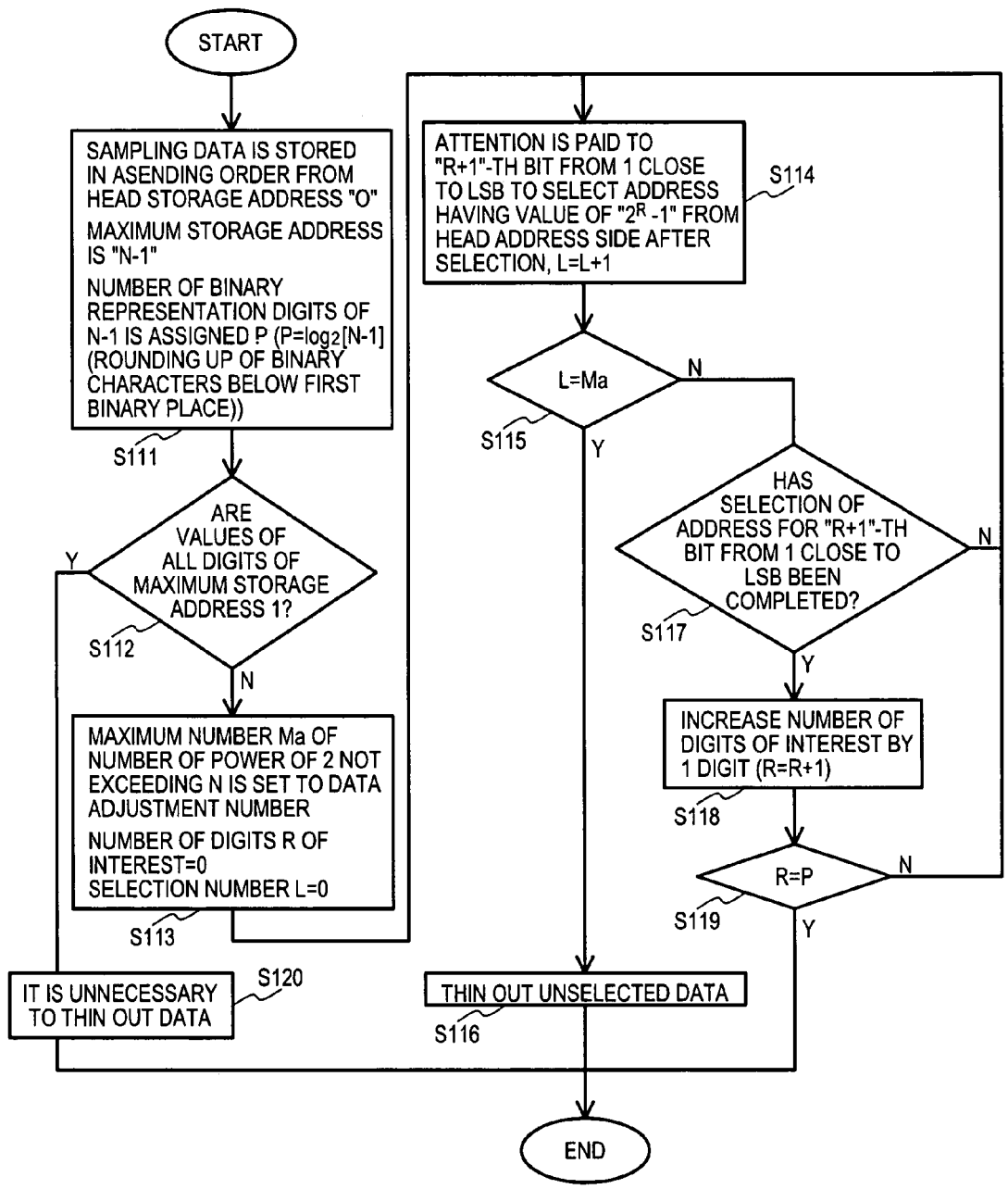
FIG. 4 is a flow diagram showing one example of a processing flow for thinning out data for an observation apparatus according to Embodiment 1 of the present invention.
Figure 5:
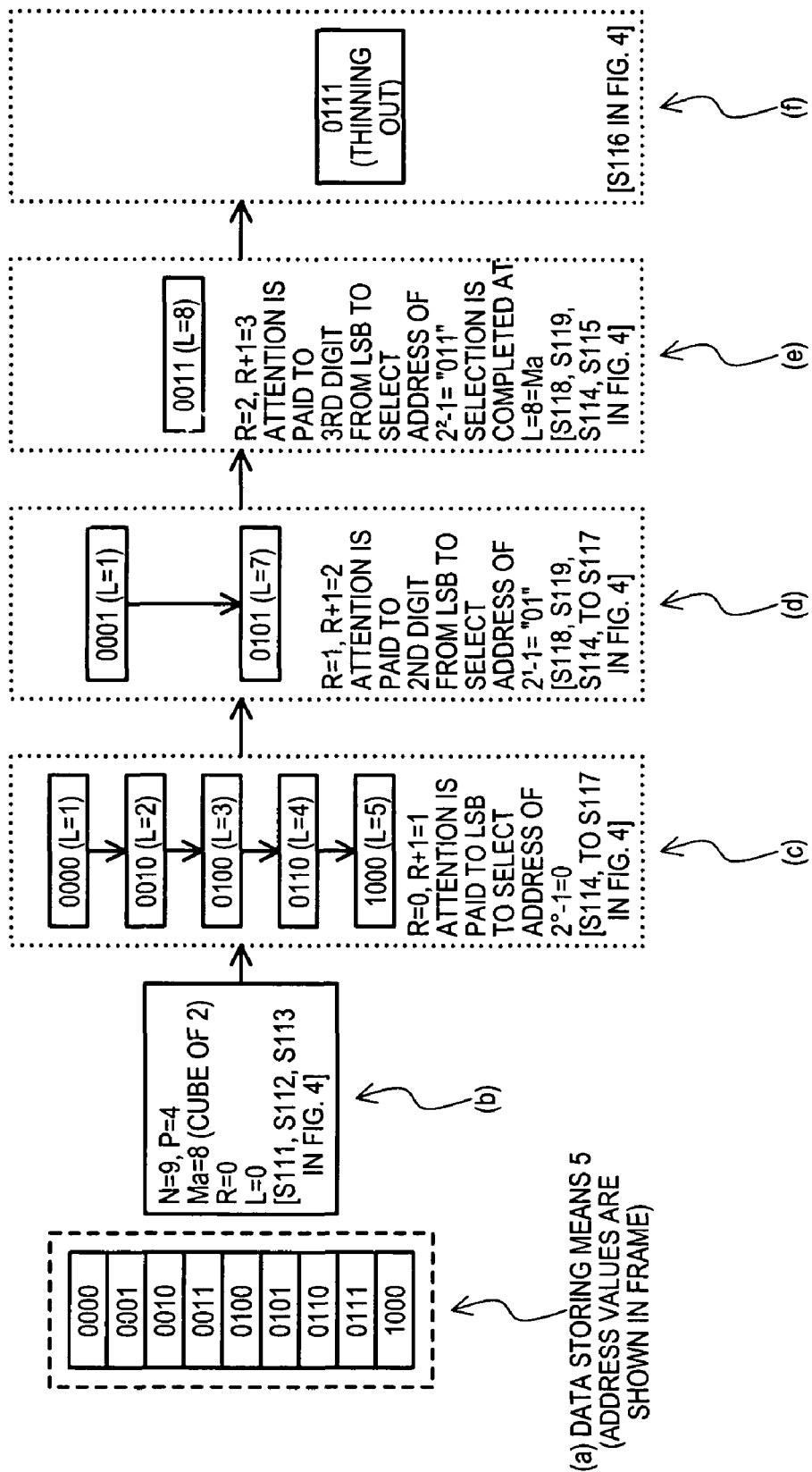
FIG. 5 is a block diagram showing one example of a processing flow for thinning out data for an observation apparatus according to Embodiment 1 of the present invention.

A detailed description of the operation of one example of an observation apparatus according to Embodiment 1 will now be described with reference to FIGS. 4 and 5. FIG. 4 is a flow chart showing a processing flow for an observation apparatus for thinning out data samples. FIG. 5 is a block diagram showing one processing example of the thinning out of sample data.

As shown in FIGS. 2 and 3, in an observation apparatus according to Embodiment 1, data stored in data storing means 5 can be thinned out by data adjusting means 6. In the present example, sampled data can be thinned out to arrive at a data sample number that is a power of 2.

Referring to FIG. 4, a description will now be given with respect to a data thinning out process that can arrive at data sample number that is a power of 2. Sampling data, which has been sampled by sampling means 3, can be stored in data storing means 5, in an ascending order beginning with a start address.

A start address in this example is "0" (hereinafter, binary numbers will be denoted by quotation marks). Assuming that a maximum number of data samples in storing means 5 is N, a maximum storage address can be N−1. Thus, it will be assumed that the number of digits in a binary representation of N−1 is P (i.e., $P=\log_2(N-1)$, rounding up for values below a first binary place)) (step S111 of FIG. 4).

An operation can then determine if sampled data has been stored up to a maximum storage address (S112) that is a power of two. Such a maximum storage address can be an address "11 . . . 1" (where the number of 1s is the value P) (step S112 of FIG. 4). If data samples are stored at a maximum storage address (e.g., stored at an address where all P digits are 1), this can indicate the acquisition of N data samples. Because N is a power of two, such a data sample number is already conducive to fast Fourier transform (FFT) analysis, and there can be no need to thin out sampled data (step S120 in FIG. 4).

If a maximum address of a sampled data does not include all 1s (e.g., maximum storage address not reached), an adjustment number Ma can be set to be a maximum value that is power of two, yet does not exceed N. At the same time, a value R and a value L can both be initialized to "0". A value R can be a number of "digits of interest". Digits of interest can be the number binary digits that are examined (e.g., to which attention is paid) by data adjusting means 6 in the operation. A value L can be a selection number that is set in order to select data (step S113 of FIG. 4).

As shown in FIG. 4, an operation can continue by examining (paying attention to) an R+1-th bit from that next to the least significant bit (LSB) of the address to thereby selecting addresses having a value of $2^R-1$ from a head (e.g., base) address. For example, in the case where R is initially 0, attention can be paid to a first (0+1)-th bit from that below the LSB, which can be the LSB itself. Such a bit can be examined to select all addresses, starting with base address "0", that include a $0(2^0-1)$ as an LSB. Thus, initially address 0000 can be identified for selection. After such a selection, a selection number L can be incremented (L=L+1).

In this way, selection can continue based on all addresses in which an LSB equals $2^0-1=0$. Thus, in the example set forth (N=9), such a step can selected addresses "0000", "0010", "0100", "0110" and "1000". At the end of such operations a selection number L may have been incremented up to 5. It is understood the remaining addresses have a 1 as a least significant bit, and so are not selected.

After an address for sampling data has been selected according to a number of digits of interest R and given selection number L has been incremented, the selection number L can be compared to a value Ma. It will be recalled Ma is a maximum number that is a power of 2, but does not exceed a number of data N. If a selection number L is different than maximum value Ma, a next address meeting the selection criteria can be selected (step S115 of FIG. 4). In the example of FIG. 4, a selection number L can be incremented by 1 in a step S115. However, because L is initially set to 0 (e.g., step S113) and Ma is a power of two, not exceeding N, all cases in which L does not equal M can be cases in which L is less than M.

After selection has been carried out according to the above criteria (LSB=0) (step S117 of FIG. 4, "Y" branch), the number of digits of interest R can be incremented to provide new R value (R=R+1) (step S118 of FIG. 4). If the number of digits of interest R is not equal to a maximum number of address digits P, an operation can return to a step S114 and carry out the selection process according to a next set of criteria (step S119 of FIG. 4, "N" branch). For example, in the case where R is incremented to 1, attention can be paid starting with a second (1+1)-th bit from that below the LSB, which can be the first two LSBs. Such bits can be examined to select all addresses, starting with base address "0" that include a "01" ($2^1-1$) as the two LSBs. Thus, initially, address 0001 can be identified for selection. After such a selection, a selection number L (previously 5) can be incremented (L=L+1=6). Once again, selection of addresses can continue based this new criteria (last two LSBs equal $2^1-1$="01"). Thus, in the example set forth (N=9), such a step can select addresses "0001" and "0101". At the end of such operations a selection number L may have been incremented up to 7. It is understood the remaining addresses do not have a "01" as the two least significant bits, thus are not selected.

Still further, following such a second selection process, a number of digits of interest R can be incremented once more, and processing can continue as indicated above. For example, addresses will next be selected that include "011" ($2^2-1$) as the least three significant bits.

Eventually the relationship L=Ma can be established. Once such relationship has been established, a number of selected data samples can be a maximum number that is a power of two, and hence a number amenable to fast Fourier transform (FFT) analysis. Unselected data can be thinned out to complete an adjustment which results in a number sample data equal to of Ma (a power of 2) (step S116 in FIG. 4).

One example of a processing to thin out data according to the operation shown in FIG. 4 will be described with reference to FIG. 5. As shown by FIG. 5(a), sampled data can be stored from addresses "0000" to "1000" of data storing means 5. Thus, a number of sample data stored N is equal to 9.

As shown by FIG. 5(b), with N=9, a maximum address for stored data is N−1 or binary "1000". Further, a value for digits of interest P can be 4, by rounding up $\log_2[9]$ (step S111 in FIG. 4). Because a maximum address for stored data "1000" is not all 1s (step S112 in FIG. 4), a maximum value of Ma can be generated that is a power of two, but does not exceed N. Thus, maximum value Ma is 8 ($2^3$). Further, a digit of interest value R and selection number L can both be set to 0 (step S113 in FIG. 4).

As shown in FIG. 5(c), with respect to data stored in a sampling means 5, an initial value of the number of digits of interest R can be 0. Thus, attention can be paid to the first (R+1, where R=0) bit next to that below the LSB, which in this case is the LSB itself. Addresses which include an LSB value of 0 ($2^R-1$, where R=0) can be selected starting with a base address "0000". Whenever such an address is selected, a selection number L can be incremented by 1. Thus, as shown in FIG. 5(c) the following addresses can be selected "0000", "0010", "0100", "0110" and "1000". Such a selection operation can result in a selection number L counting up from 1 to 5 (step S114 in FIG. 4).

Still further, as represented by FIG. 5(c), a selection number L can repeatedly compared to maximum value Ma (8, in this example) (step S115 in FIG. 4). At this time, selection number L=5 does not equal maximum value Ma=8. Once sample data selection according to a first bit (R+1, R=0) from that below the LSB has been completed (step S117 in FIG. 4), the number of digits of interest R, can be incremented from R=0 to R=0+1=1. At this time, the digits of interest R=1 is not equal to an address digit number P=4 (step S118 of FIG. 4). Thus, an operation can continue by selecting more data samples according to new selection criteria (R=1).

As shown in FIG. 5(d), with respect to data stored in a sampling means 5, an incremented value of the number of digits of interest R can be 1. Thus, attention can be paid to the two (R+1, where R=1) bits next to that below the LSB, which in this case is the two LSBs of the address. Addresses which include two LSB values of "01"($2^R-1$, where R=1) can be selected. Whenever such an address is selected, a selection number L can be incremented by 1. Thus, as shown in FIG. 5(d), the following addresses can be selected "0001" and "0101". Such a selection operation can result in a selection number counting up from 5 to 7 (step S114 in FIG. 4).

Referring still to FIG. 5(d), a selection number L can then be compared to maximum value Ma (8, in this example) (step S115 in FIG. 4). At this time, selection number L=7 does not equal maximum value Ma=8. Once sample data selection according to the first two bits (R+1, R=1) from that below the LSB has been completed (step S117 in FIG. 4), the number of digits of interest R, can be incremented once again R=1 to R=1+1=2. At this time, the digits of interest R=2 is not equal to an address digit number P=4 (step S118 of FIG. 4). Thus, an operation can continue by selecting more data samples according to new selection criteria (R=2).

As shown in FIG. 5(e), with respect to data stored in a sampling means 5, an incremented value of the number of digits of interest R can be 2. Thus, attention can be paid to the three bits (R+1, where R=2) next to that below the LSB, which in this case is the three LSBs of the address. Addresses which include two LSB values of "011"($2^R-1$, where R=2) can be selected. Whenever such an address is selected, a selection number L can be incremented by 1.

Thus, as shown in FIG. 5(e) the following address can be selected "0011". Such a selection operation can result in a selection number counting up from 7 to 8 (step S114 in FIG. 4).

Referring still to FIG. 5(e), a selection number L can then be compared to maximum value Ma (8, in this example) (step S115 in FIG. 4). At this time, selection number L=8 is equal maximum value Ma=8. In other words, at this point in time, once data at address "0011" has been selected, the selection number L is 8, and the number of data samples selected can be 8, which is a highest power of 2 not exceeding a maximum number of data samples N (step S115 of FIG. 4).

Referring to FIG. 5(f), an operation can thin out data by thinning out any addresses not selected by previous functions. In this particular case, address "0111" can be thinned out from the data samples, as it is the only address from "0000" to "1000" that is not selected by the above operation.

As has been described above, an observation apparatus according to an Embodiment 1 can adjust a number of data samples obtained by a sampling means 3 to a maximum number Ma that is a power of two that does not exceed a number of data samples N. In general, a number N of data samples can depend upon a period T, at which a timing signal is generated and a sampling rate time t (N=T/t, rounding down). Thus, when a period T is decreased, or a sampling rate time t is increased, in order to efficiently observe a frequency spectrum of a power supply current, a number N can be decreased. On the other hand, by adjusting a maximum number of data samples Ma to a maximum power of two not exceeding N, the arithmetic operation of a Fourier transform operation can be efficiently performed on the data irrespective of a period T and sampling rate time t.

Furthermore, in an observation apparatus of Embodiment 1, because a number data samples is adjusted to Ma, and Ma is a maximum power of two not exceeding N, it can be possible to execute the arithmetic operation for a fast Fourier transform (FFT). In general, assuming that a number of sampled data is m (m: an arbitrary number that is a power of 2), the number of arithmetic operations involved in a discrete Fourier transform (DFT) is on the order of $m^2$. In contrast, the number of arithmetic operations involved in a fast Fourier transform (FFT) can be on the order of $\log_2 m$.

As noted above, because an observation apparatus according to Embodiment 1 can adjust a sample data number to Ma, it can be possible to undertake a Fourier transform operation according to a fast Fourier transform (FFT). For this reason, in an observation apparatus according to Embodiment 1, a number of arithmetic operations for a Fourier transform can be on the order of (Ma/2) $\log_2$Ma. Because the relationship (Ma/2) $\log_2$Ma<$N^2$ can be established, the amount of time required to observe the frequency spectrum of a current observation signal can be reduced.

As a result, because an observation apparatus of Embodiment 1 includes a fast Fourier transform (FFT) operation, the number of arithmetic operations can be greatly reduced as compared to those that utilize a discrete Fourier transform (DFT). Thus, such a high speed operation as a fast Fourier transform (FFT) can make it possible to realize high speed and efficient observation of the frequency spectrum of a power supply current.

In addition, in the observation apparatus according to Embodiment 1, when a data number adjusting means 6 adjusts a number of data N to a maximum number Ma (a maximum power of two, not exceeding N), such an adjustment is carried out on the basis of an addresses in a memory space of data storing means 5 having sampled data stored therein. Thus, such an adjusting can be performed without executing any arithmetic operations for newly selecting and deleting data samples. For this reason, the number of data can be efficiently adjusted without executing such arithmetic operations, and hence arithmetic operations for a fast Fourier transform (FFT) can be more efficiently executed.

Furthermore, in an observation apparatus of Embodiment 1, because data number adjusting means 6 thins out data from sampling data stored in data storing means 5 to thereby adjust a number of sample data, sampled data that is thinned out from data storing means 5 can be deleted. This can allow an adjustment of the number of data to be simple and efficient.

In the observation apparatus of Embodiment Mode 1, a number Ma can be the number of data after adjustment. Because the number Ma can be a maximum number that is a power of two not exceeding N, such an approach can be effective where there are a large number of data N prior to adjustment, and there is a need to reduce a number of data samples in order to execute a Fourier transform. In this case, the number of data N can be reduced to allow a fast Fourier transform (FFT) to be more effectively executed.

Embodiment 2 of the Invention.

A second embodiment of the present invention (hereinafter Embodiment 2) will now be described. Embodiment 2 can include an observation apparatus for observing a frequency spectrum of a power supply current in which data can be inserted into sampled data to adjust an overall number of a sampled data to a power of two. In addition, in an observation apparatus of Embodiment 1, an arithmetic operation can be executed for a specific frequency and the magnitude of a higher harmonic component thereof with respect to a power supply current of an integrated circuit under test. Such an arithmetic operation can be a fast Fourier transform (FFT) and thus obtain such results at a high speed.

An observation apparatus according to Embodiment 2 can have the same general configuration as Embodiment 1, and thus will be described with reference to FIG. 1. For Embodiment 2 a data number adjusting apparatus 6 will be described in detail. Remaining constituents of Embodiment 2 can be essentially the same as Embodiment 1, thus a description thereof will be omitted.

In the observation apparatus of Embodiment 1, a data number adjusting means 6 can thin out data from data samples by data sampling means 3 to thereby adjust a number of data samples to a power of two. In contrast, in an observation apparatus according to Embodiment 2, a data number adjusting means 6 can have the function of inserting data into the sampled data to thereby adjust a number of data samples to a power of two. In addition, in an observation apparatus according to Embodiment 2, a control means 1 can input an operation instruction to a data number adjusting means 6 to instruct data number adjusting means 6 to insert data into sampling data to thereby adjust a number of data to be a power of two. Such a number of data samples can allow for a fast Fourier transform (FFT).

An observation apparatus according Embodiment 2 can be realized as a program executed by a computer to realize the above functions. In such an embodiment, programs for executing the functions are stored on a machine readable storage medium, and can be loaded by a computer in order to carry out the functions. In the form of a computer program, an Embodiment 2 can be made available for execution by distributed processing with hardware resources such as a computer, or the like. Alternatively, such a computer program may be a signal configuration available to a single computer, or the like.

Figure 6:
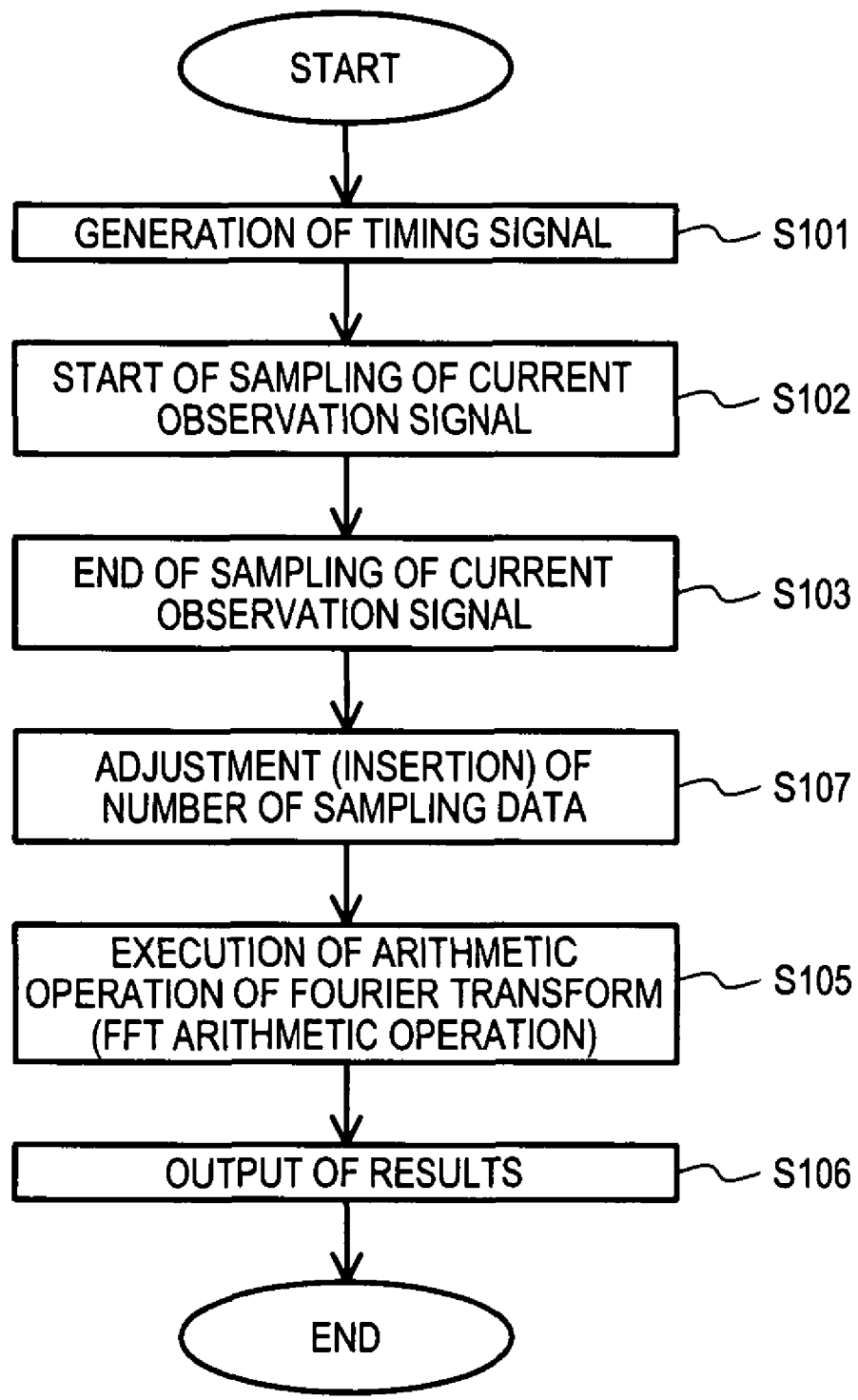
FIG. 6 is a flow diagram showing one example of a processing flow of an observation apparatus according to a second embodiment (Embodiment 2) of the present invention.
Figure 7:
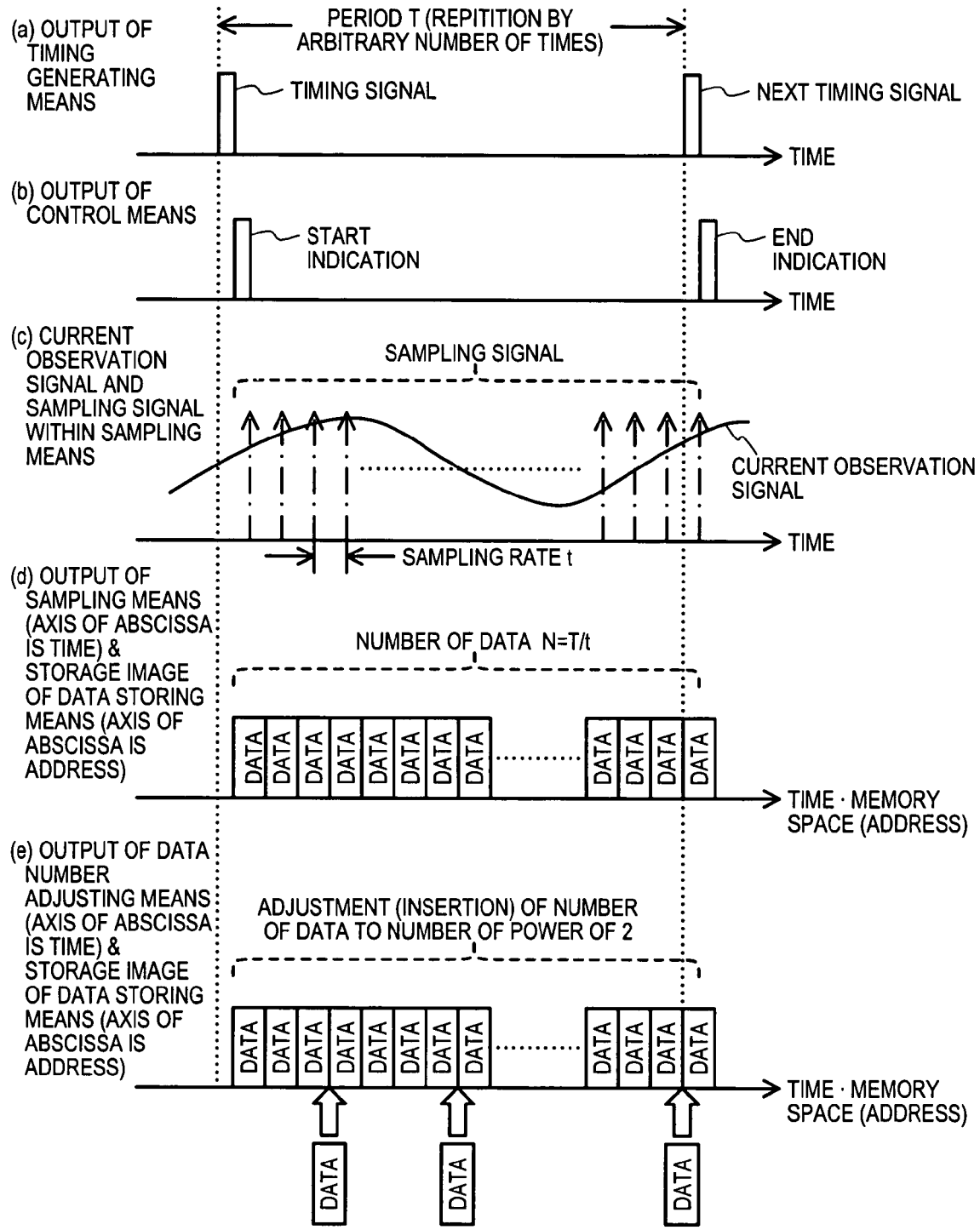
FIG. 7 is a timing diagram and memory space schematic diagram showing the operation of an observation apparatus according to Embodiment 2 of the present invention.

Next, an example of the operation of an observation apparatus according to Embodiment 2 will be described with reference to FIGS. 6 and 7. FIG. 6 is a flow chart showing one processing flow of an observation apparatus of Embodiment 2. FIG. 7 is a timing diagram with an accompanying schematic diagram showing the operation of an observation apparatus of Embodiment 2. More particularly, the axes of abscissa for FIG. 7(*d*) and FIG. 7(*e*) show both time and memory address of a memory space (e.g., a memory space within data storing means 5).

Because processing steps S101 to S103 of FIG. 6 (corresponding to FIG. 7(*a*) to 7(*c*)) can be the essentially the same as Embodiment 1, a description thereof is omitted here. Thus, remaining processing steps S107 and S106 of FIG. 6 (corresponding to FIGS. 7(*d*) and 7(*e*)) will now be described.

As shown in FIG. 7(*d*), data sampled by sampling means 3 can be output to a data storing means 5, and may be temporarily stored herein. At this time, sampling data can be stored in an ascending order with a storage address (e.g., "0") as a start of an address range (a start or "head" address). A number of stored data samples can depend upon sampling period "T", at which timing signal (e.g., FIG. 7(*a*)) is generated, and a sampling rate time "t". In such an arrangement, a number of data samples can correspond to the relationship T/t (omitting a remainder).

When sampling data has been temporarily stored in data storage means 5, control means 1 can issue an operation instruction to data number adjusting means 6. Such an operation instruction can be a data number adjustment instruction that instructs data number adjusting means 6 to adjust a number of sampled data. In this way, data number adjusting means 6 can adjust the number of data samples from those stored in data storing means 5 (step S107 in FIG. 6). In particular, data number adjusting means 6 can adjust the number of data samples to a number that is a power of two. Such an operation can ensure that sampled data can be subject to a Fourier transform operation according to the fast Fourier transform operation (FFT).

In an observation apparatus according to Embodiment 1, as shown in FIG. 7(*e*), a data number adjusting means 6 can insert data into data stored in data storing means 5 to thereby adjust the number of data samples. For example, assuming that the number of data samples is N, a data number adjusting means 6 can insert data to adjust the number of data samples to be a minimum power of two that exceeds the number N (here, a resulting power-of-two number will be identified as Mb). After adjusting the number of data samples, data number adjusting means 6 can output such adjusted data samples to arithmetic operation means 4.

After a data number adjusting means 6 has adjusted a number of data samples, a control means 1 can issue an arithmetic operation start instruction to arithmetic operation means 4. In response to such an instruction, arithmetic operation means 4 can read out adjusted data samples and execute fast Fourier transform (FFT) operations thereon (step S105 in FIG. 6). Thereafter, arithmetic operation means 4 can output results of the arithmetic operation to a display portion, or the like, of the observation apparatus concerned (step S106 in FIG. 6).

Figure 8:
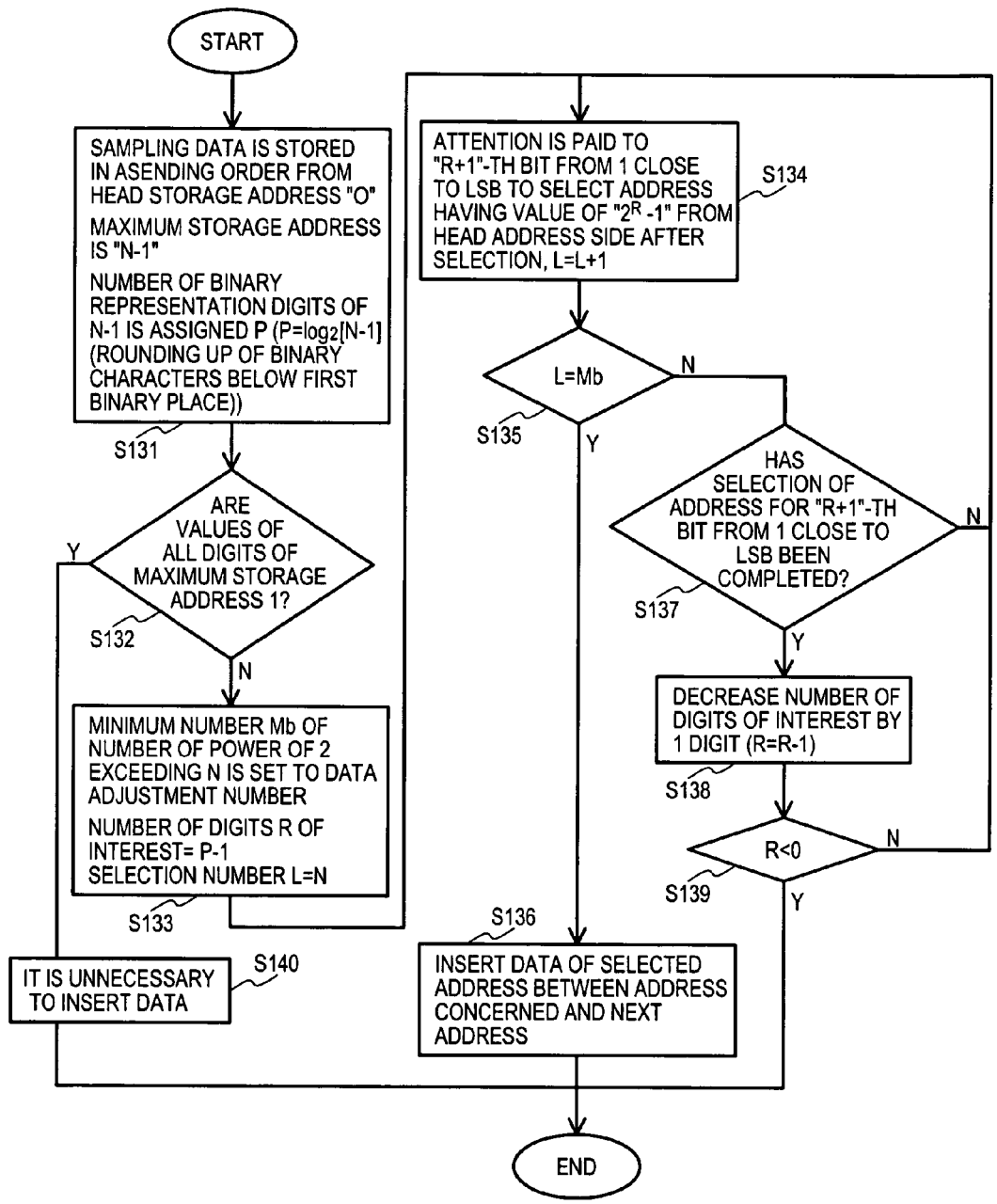
FIG. 8 is a flow diagram showing one example of a processing flow for inserting data of an observation apparatus according to Embodiment 2 of the present invention.
Figure 9:
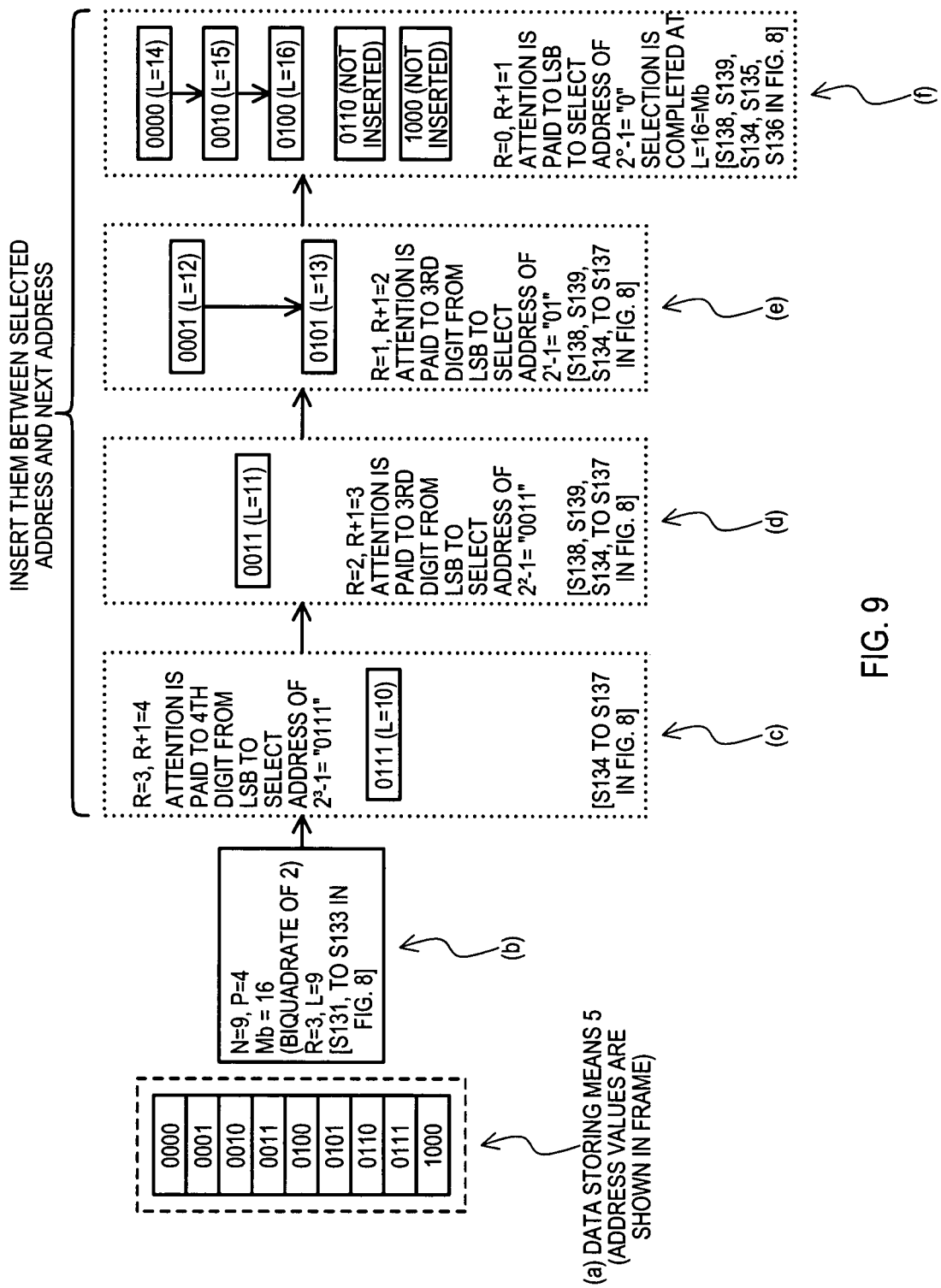
FIG. 9 is a block diagram showing one example of a processing flow for inserting data of an observation apparatus according to Embodiment 2 of the present invention.

A detailed description of the operation of one example of an observation apparatus according to Embodiment 2 will now be described with reference to FIGS. 8 and 9. FIG. 8 is a flow chart showing a processing flow for an observation apparatus for inserting data into data samples. FIG. 9 is a block diagram showing one processing example of the inserting data.

As shown in FIGS. 8 and 9, in an observation apparatus according to Embodiment 2, data can be inserted into data stored in data storing means 5 by data adjusting means 6. In the present example, data can be inserted into sampled data to arrive at a data sample number that is a power of 2.

Referring to FIG. 8, a description will now be given with respect to a process of inserting data to arrive at data sample number that is a power of 2. Sampling data, which has been sampled by sampling means 3, can be stored in an ascending order, beginning with a start address, in data storing means 5.

A start address in this example can be "0". Assuming that a maximum number of data samples in storing means 5 is N, a maximum storage address can be N-1. Thus, it will be assumed that the number of digits in a binary representation of N-1 is P (i.e., $P=\log_2(N-1)$, rounding up for values below a first binary place) (step S131 of FIG. 8).

An operation can then determine if sampled data has been stored up to a maximum storage address. In one arrangement, this can include a data number adjusting means 6 determining whether sampled data is stored at a maximum storage address of data storing means 5. A maximum storage address can be an address "11 . . . 1"(where the number of 1s is the value P) (step S132 of FIG. 8). If data samples are stored at a maximum storage address (e.g., stored at an address where all P digits are 1), this can indicate the acquisition of N data samples. Because N is a power of two, such a data sample number is already conducive to fast Fourier transform (FFT) analysis, and there can be no need to adjust the number of sampled data (step S140 in FIG. 8).

If a maximum address of a sampled data does not include all 1s (e.g., maximum storage address not reached), an adjustment number Mb can be set to a minimum value that is power of two yet exceeds N. At the same time, a number of digits of interest R can be set to a value R=P-1. Further, a selection number L can be set to a value L=N (step S133 of FIG. 8).

As shown in FIG. 8, an operation can continue by examining (paying attention to) to address bits from the R+1-th bit from a bit below the least significant bit (LSB) of the address. In this case, such bits include all four address bits. Beginning at a start address (e.g., "0"), the operation can select addresses having a value of $2^R-1=2^{P-1}-1$, for all four bits. That is, sampling data stored in an ascending order within data storing means 5 can be selected in an ascending order from start address "0" according to such selection criteria. After each such a selection, a selection number L can be incremented (L=L+1) (step S114 of FIG. 4).

After an address for sampling data has been selected according to a number of digits of interest R and given selection number L has been incremented, the selection number L can be compared to a minimum Mb. It will be recalled Mb is a minimum number that is a power of 2 that exceeds a number of data N. If a selection number L is different than minimum value Mb, a next address meeting the selection criteria can be selected (step S135 of FIG. 8). In the example of FIG. 8, a selection number L can be incremented by 1 in a step S134. However, because L is initially set to N (e.g., step S133) and Mb is a minimum power of two exceeding N, all cases in which L does not equal Mb can be cases in which L is less than Mb.

After selection has been carried out according to the above criteria (step S137 of FIG. 8, "Y" branch), the number of digits of interest R can be decremented to provide a new R value (R=R-1) (step S138 of FIG. 8). If selection of addresses based on such criteria is not complete, an operation can return to step S134 in FIG. 8, and selection according to the new digits of interest can continue until all addresses meeting the criteria have been selected (step S137 of FIG. 8, "N" branch).

For example, in the case where R is decremented by 1, the number of digits of interest becomes R=P-2. Thus, addresses can be selected beginning with a start address, on the condition that the address bits of interest begin at the (R+1)-th bit=(P-1)-th bit, from the bit next to the LSB. Selection is based on such bits meeting the criteria $2^R-1=2^{(P-2)}-1$.

Processing according to the operations of S133 to S138 can continue as a digits of interest value R is successively decreased by one, unless such a value falls below 0 (step S139 of FIG. 8). Eventually the relationship L=Mb can be established. Once such relationship has been established, a number of selected data samples can be a power of two, and hence a number amenable to fast Fourier transform (FFT) analysis. Selected data can be inserted into existing sampling data to complete an adjustment which results in a number sample data equal to of Mb (a power of 2) (step S136 in FIG. 8).

One example of a processing to insert data according to the operation shown in FIG. 8 will be described with reference to FIG. 9. As shown by FIG. 9(a), sampled data can be stored from addresses "0000" to "1000" of data storing means 5. Thus, a number of sample data stored N is equal to 9.

As shown by FIG. 9(b), with N=9, a maximum address for stored data is N-1 or binary "1000". Further, a value for digits of interest P can be 4, by rounding up $\log_2[9]$ (step S131 in FIG. 8). Because a maximum address for stored data "1000" is not all 1s (step S132 in FIG. 8), a minimum value of Mb can be generated that is a power of two which exceeds N. Thus, minimum value Mb is 16 ($2^4$). Further, a digit of interest value R can be set to P-1=3, and selection number L can set to N=9 (step S133 in FIG. 8).

As shown in FIG. 9(c), with respect to data stored in a sampling means 5, an initial value of the number of digits of interest R can be 3. Thus, attention can be paid to the first four (R+1, where R=3) bits next to the LSB. Addresses which include values for such bits of "0111"($2^R-1$, where R=3) can be selected starting with a base address "0000". Whenever such an address is selected, a selection number L can be incremented by 1. Thus, as shown in FIG. 9(c) the following address can be selected "0111". Such a selection operation can result in a selection number L counting up from 9 to 10 (step S134 in FIG. 8).

Still further, as represented by FIG. 9(c), a selection number L can then be compared to minimum value Mb (16, in this example) (step S135 in FIG. 8). At this time, selection number L=10 does not equal minimum value Mb=16. Once sample data selection according to a first set of bits (R+1, R=3) from that below the LSB has been completed (step S137 in FIG. 8), the number of digits of interest R, can be decremented from R=3 to R=3-1=2. At this time, the digits of interest R=2 is not less than 0 (step S139 of FIG. 8). Thus, an operation can continue by selecting more data samples according to new selection criteria (R=2).

As shown in FIG. 9(d), with respect to data stored in a sampling means 5, a decremented value of the number of digits of interest R can be 2. Thus, attention can be paid to the three (R+1, where R=2) bits from that next to LSB, which in this case is the three LSBs of the address. Addresses which include thee LSB values of "011"($2^R-1$, where R=2) can be selected. Whenever such an address is selected, a selection number L can be incremented by 1. Thus, as shown in FIG. 9(d) the following address can be selected "0011". Such a selection operation can result in a selection number L counting up from 10 to 11 (step S134 in FIG. 8).

Referring still to FIG. 9(d), a selection number L can then be compared to minimum value Mb (16, in this example) (step S135 in FIG. 8). At this time, selection number L=11 still does not equal minimum value Mb=16. Once sample data selection according to the first two three (R+1, R=2) from the LSB has been completed (step S137 in FIG. 8), the number of digits of interest R, can be decremented once again R=2 to R =2−1=1. At this time, the digits of interest R=1 is not less than 0 (step S138 of FIG. 8). Thus, an operation can continue by selecting more data samples according to new selection criteria (R=1).

As shown in FIG. 9(e), with respect to data stored in a sampling means 5, a decremented value of the number of digits of interest R can be 1. Thus, attention can be paid beginning with the two bit (R+1, where R=2) from that next to the LSB, which in this case is the two LSBs of the address. Addresses which include two LSB values of "01"($2^R$−1, where R=1) can be selected. Whenever such an address is selected, a selection number L can be incremented by 1. Thus, as shown in FIG. 9(e) the following addresses can be selected "0001" and "0101". Such a selection operation can result in a selection number counting up from 11 to 13 (step S134 in FIG. 8).

Referring still to FIG. 9(e), a selection number L can then be compared to minimum value Mb (16, in this example) (step S135 in FIG. 4). At this time, selection number L=13 is not equal to minimum value Mb=16. Once sample data selection according to the first two (R+1, R=2) from that next to the LSB has been completed (step S137 in FIG. 8), the number of digits of interest R, can be decremented once again R=1 to R=1−1=0. At this time, the digits of interest R=0 is not less than 0 (step S138 of FIG. 8). Thus, an operation can continue by selecting more data samples according to new selection criteria (R=0).

As shown in FIG. 9(f), with respect to data stored in a sampling means 5, a decremented value of the number of digits of interest R can be 0. Thus, attention can be paid beginning with first bit (R+1, where R=0) next to the LSB, which in this case is the LSB itself. Addresses which include an LSB value of "0"($2^R$−1, where R=0) can be selected. Whenever such an address is selected, a selection number L can be incremented by 1. Thus, as shown in FIG. 9(f) the following addresses can be selected "0000", "0010" and "0100". Such a selection operation can result in a selection number counting up from 13 to 16 (step S134 in FIG. 8).

Referring still to FIG. 9(f), a selection number L can repeatedly compared to minimum value Mb (16, in this example) (step S135 in FIG. 4). At this time, selection number L=16 equals minimum value Mb=16. In other words, at this point in time, once data at address "0100" has been selected, the selection number L is 16, thus a number of data samples selected can be 16, which is a minimum power of 2 that exceeds the number of data samples N (step S135 of FIG. 8). At the same time, as also shown in FIG. 9(f), addresses "0110" and "1000" which are not yet selected by processing are not inserted. In this way, processing for inserting data values can be completed (step S156 of FIG. 8).

As has been described above, an observation apparatus according to an Embodiment 2 can adjust a number of data samples obtained by a sampling means 3 to a minimum number Mb that is a power of two that exceeds a number of data samples N. In general, a number N of data samples can depend upon a period T, at which a timing signal is generated and a sampling rate time t (N=T/t, rounding down). Thus, when a period T is decreased, or a sampling rate time t is increased, in order to efficiently observe a frequency spectrum of a power supply current, a number N can be decreased. On the other hand, by adjusting a minimum number of data samples Mb to a minimum power of two exceeding N, the arithmetic operation of a Fourier transform operation can be efficiently performed on the data irrespective of a period T and sampling rate time t.

Furthermore, in an observation apparatus of Embodiment 2, because a number of data samples is adjusted to Mb, and Mb is a minimum power of two that exceeds N, it can be possible to execute the arithmetic operation for a fast Fourier transform (FFT). In general, assuming that a number of sampled data is m (m: an arbitrary number that is a power of 2), the number of arithmetic operations involved in a discrete Fourier transform (DFT) is on the order of $m^2$. In contrast, the number of arithmetic operations involved in a fast Fourier transform (FFT) can be on the order of $\log_2 m$.

As noted above, because an observation apparatus according to Embodiment 2 can adjust a sample data number to Mb, it can be possible to undertake a Fourier transform operation according to a fast Fourier transform (FFT). For this reason, in an observation apparatus according to Embodiment 2, a number of arithmetic operations for a Fourier transform can be on the order of (Mb/2) $\log_2$ Mb. Because the relationship (Mb/2) $\log_2$ Mb <$N^2$ can be established, the amount of time required to observe the frequency spectrum of a current observation signal can be reduced.

As a result, because an observation apparatus of Embodiment 2 includes a fast Fourier transform (FFT) operation, the number of arithmetic operations can be greatly reduced as compared to those that utilize a discrete Fourier transform (DFT). Thus, such a high speed operation as a fast Fourier transform (FFT) can make it possible to realize high speed and efficient observation of the frequency spectrum of a power supply current.

In addition, in the observation apparatus according to Embodiment 2, when a data number adjusting means 6 adjusts a number of data N to a minimum number Mb (a minimum power of two exceeding N), such an adjustment is carried out on the basis of addresses in a memory space of data storing means 5 having sampled data stored therein. Thus, such an adjusting can be performed without executing any arithmetic operations for newly generating data samples. For this reason, the number of data can be efficiently adjusted without executing such arithmetic operations, and hence arithmetic operations for a fast Fourier transform (FFT) can be more efficiently executed.

Furthermore, in an observation apparatus of Embodiment 2, because data number adjusting means 6 inserts data into sampled data stored in data storing means 5 to thereby adjust a number of sample data, this can allow an adjustment of the number of data to be simple and efficient.

In the observation apparatus of Embodiment Mode 2, a number Mb can be the number of data after adjustment. Because the number Mb can be a minimum number that is a power of two exceeding N, such an approach can be effective where there are fewer numbers of data N prior to adjustment. Such an approach may also be effective when there is a need to increase a number of data samples in order to execute a Fourier transform. In this case, the number of data N can be increased to allow a fast Fourier transform (FFT) to be more efficiently executed.

Embodiment 3 of the Invention.

A third embodiment of the present invention (hereinafter Embodiment 3) will now be described. Embodiment 3 can include an observation apparatus for observing a frequency spectrum of a power supply current in which data can be thinned out from sampled data or inserted into sampled data to arrive at an adjusted sampled data number that is a power of two. In addition, in an observation apparatus of Embodiment 3, an arithmetic operation can be executed for a specific frequency and the magnitude of a higher harmonic component thereof with respect to a power supply current of an integrated circuit under test. Such an arithmetic operation can be a fast Fourier transform (FFT), and thus obtain such results at a high speed.

An observation apparatus according to Embodiment 3 can have the same general configuration as Embodiment 1 and Embodiment 2, and thus will be described with reference to FIG. 1. For Embodiment 3 a data number adjusting apparatus 6 will be described in detail. Remaining constituents of Embodiment 3 can be essentially the same as Embodiments 1 and 2, thus a description thereof will be omitted.

As will be recalled, in the observation apparatus of Embodiment 1, a data number adjusting means 6 can thin out data samples of data sampling means 3. In the observation apparatus of Embodiment 2, a data number adjusting means 6 can insert data into data samples of data sampling means 3. In an observation apparatus according to Embodiment 3, a data number adjusting means 6 can have the function of thinning out data from sampled data or inserting data into the sampled data to thereby adjust a number of data samples to a power of two.

In addition, in an observation apparatus according to Embodiment 3, a control means 1 can input an operation instruction to a data number adjusting means 6 to instruct data number adjusting means 6 to thin out data from sampling data or insert data into sampling data to thereby adjust a number of data to be a power of two. Such a number of data samples can allow for a fast Fourier transform (FFT).

Like Embodiment 1 and 2, an observation apparatus according Embodiment 3 can be realized as a program executed by a computer to realize the above functions. In such an embodiment, programs for executing the functions are stored on a machine readable storage medium, and can be loaded by a computer in order to carry out the functions. In the form of a computer program, an Embodiment 3 can be made available for execution by distributed processing with hardware resources such as a computer, or the like. Alternatively, such a computer program may be a signal configuration available to a single computer, or the like.

Figure 10:
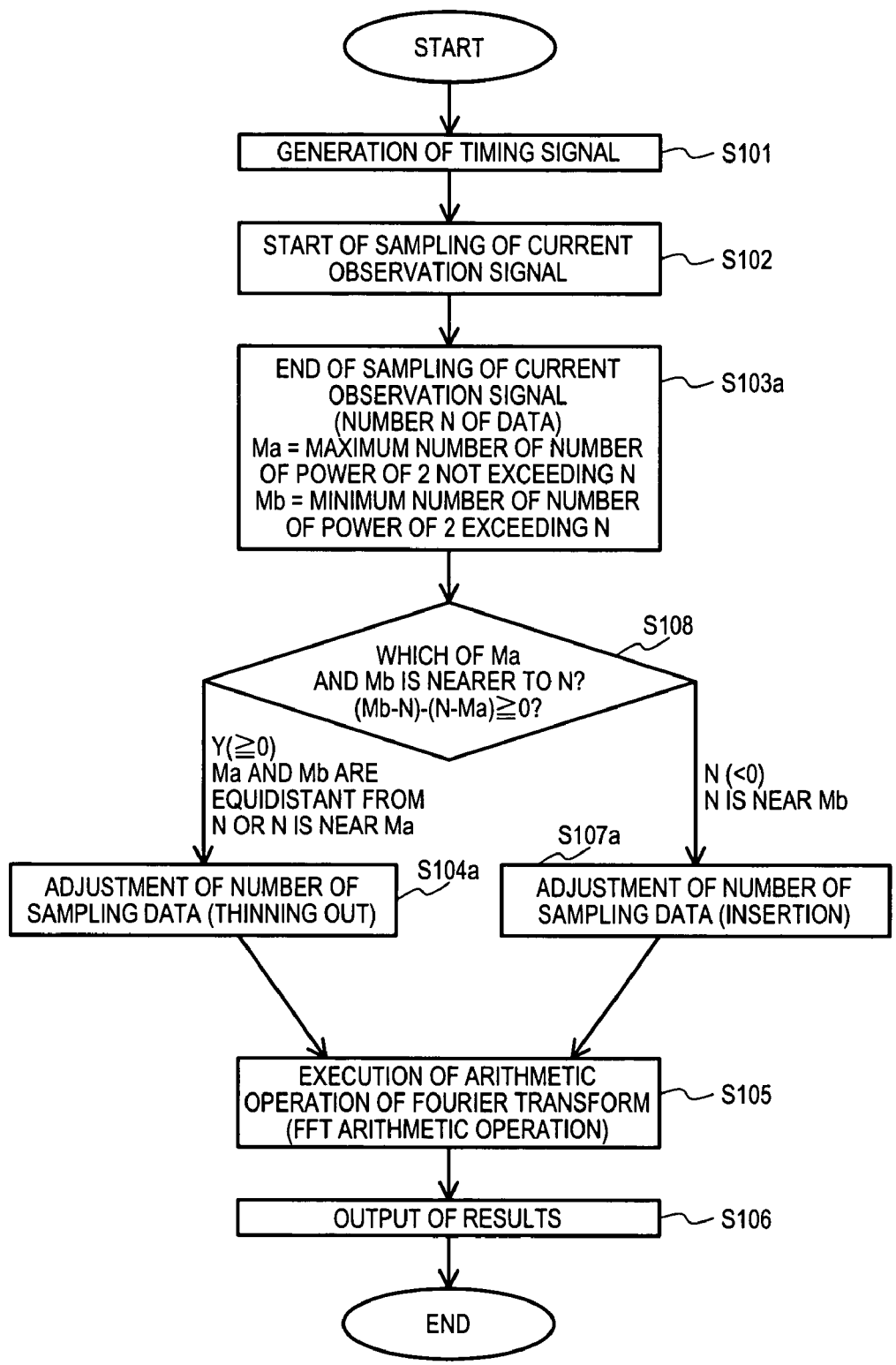
FIG. 10 is a flow diagram showing one example of a processing flow for selecting between processings for an observation apparatus according to a third embodiment (Embodiment 3) of the present invention.

Next, an example of the operation of an observation apparatus according to Embodiment 3 will be described with reference to FIG. 10. FIG. 10 is a flow chart showing one processing flow of an observation apparatus of Embodiment 3.

Because processing steps S101 and S102 of FIG. 10 can be the essentially the same as Embodiments 1 and 2, a description thereof is omitted here. Thus, remaining processing steps S103a to S106 of FIG. 10 will now be described.

Upon reception of an indication to end sampling, a sampling means 3 can end the sampling of a current observation signal. Data sampled by sampling means 3 can be output to a data storing means 5, and may be temporarily stored herein. At this time, sampling data can be stored in an ascending order with a storage address (e.g., "0") as a start of an address range (e.g., a start or "head" address). A number of stored data samples can depend upon sampling period "T", at which timing signal is generated and a sampling rate time "t". In such an arrangement, a number of data samples can correspond to the relationship T/t (omitting a remainder).

When sampling data has been temporarily stored in data storage means 5, control means 1 can issue an operation instruction to data number adjusting means 6. Such an operation instruction can be a data number adjustment instruction that instructs data number adjusting means 6 to adjust a number of sampled data.

In the observation apparatus of Embodiment 3, a data number adjusting means 6 can select between a thinning out of sampled data or an inserting of data into sampled data in accordance with a data number adjustment instruction issued from a control means 1. Thereafter, a data number adjusting means 6 can thin out sampled data, or insert data into sampled data to adjust a number of data. Then, after completion of data sampling, a data number adjusting means 6 can set a number of sampled data N, and establish a maximum value Ma and a minimum value Mb. A maximum value Ma can be a maximum value that is a power of two which does not exceed the sample data number N. A minimum value Mb can be a minimum value that is a power of two which exceeds the sample data number N (step S103a in FIG. 10).

For example, assuming that a number of sampled data is some number N, a data number adjusting means 6 can select either a data thinning out operation or data insertion operation according whether the maximum value Ma or minimum value Mb is closer to N. As a very particular example, a value [(Mb−N)−(N−Ma)] can be evaluated. If such a value is greater than 0, a number N is closer to Ma, and an observation apparatus can proceed to thin out sampled data. If such a value is less than 0, a number N is closer to Mb, and an observation apparatus can proceed to insert data into sampled data. Still further, if such a value is equal to 0, a number N is equidistant form Ma and Mb, and, in this particular example, an observation apparatus can proceed to thin out sampled data (step S108 of FIG. 10).

When a data number adjusting means 6 selects a data thinning operation, sampled data can be thinned out in the same general fashion as Embodiment 1 (step S104a of FIG. 10). In addition, when a data number adjusting means 6 selects a data insertion operation, data can be inserted into sampled data in the same general fashion as Embodiment 2 (step S107a of FIG. 10). Here, a description of the thinning out of data or insertion of data will be omitted.

Then, after having adjusted a data number of sampled data, a data number adjusting means 6 can output such adjusted sample data to arithmetic operation means 4. After data number adjusting means 6 has adjusted a number of sample data, a control means 1 can issue an arithmetic operation instruction to arithmetic operation means 4. In response to such an instruction, arithmetic operation means 4 can read out adjusted data samples and execute fast Fourier transform (FFT) operations thereon (step S105 in FIG. 10). Thereafter, arithmetic operation means 4 can output results of the arithmetic operation to a display portion, or the like, of the observation apparatus concerned (step S106 in FIG. 10).

As has been described above, an observation apparatus according to an Embodiment 3 can adjust a number of data samples obtained by a sampling means 3 to a maximum number Ma that is a power of two that does not exceed a number of data samples N, or a minimum number Mb that is a power of two which exceed the number of data samples N (hereinafter a data number after adjustment M will be referred to as Ma or Mb). In general, a number N of data samples can depend upon a period T, at which a timing signal is generated and a sampling rate time t (N=T/t, rounding down). Thus, when a period T is decreased, or a sampling rate time t is increased, in order to efficiently observe a frequency spectrum of a power supply current, a number N can be decreased. On the other hand, by adjusting a number of data samples to M (Ma or Mb), an arithmetic operation of a Fourier transform operation can be efficiently performed on the data irrespective of a period T and sampling rate time t.

Furthermore, in an observation apparatus of Embodiment 3, because a number of data samples is adjusted to M it can be possible to execute the arithmetic operation for a fast Fourier transform (FFT). In general, assuming that a number of sampled data is m (m: an arbitrary number that is a power of 2), the number of arithmetic operations involved in a discrete Fourier transform (DFT) is on the order of $m^2$. In contrast, the number of arithmetic operations involved in a fast Fourier transform (FFT) can be on the order of $\log_2 m$.

As noted above, because an observation apparatus according to Embodiment 3 can adjust a sample data number to M, it can be possible to undertake a Fourier transform operation according to a fast Fourier transform (FFT). For this reason, in an observation apparatus according to Embodiment 3, a number of arithmetic operations for a Fourier transform can be on the order of (M/2) $\log_2 M$. Because the relationship (M/2) $\log_2 M < N^2$ can be established, the amount of time required to observe the frequency spectrum of a current observation signal can be reduced.

As a result, because an observation apparatus of Embodiment 3 includes a fast Fourier transform (FFT) operation, the number of arithmetic operations can be greatly reduced as compared to those that utilize a discrete Fourier transform (DFT). Thus, such a high speed operation as a fast Fourier transform (FFT) can make it possible to realize high speed and efficient observation of the frequency spectrum of a power supply current.

In addition, in the observation apparatus according to Embodiment 3, when a data number adjusting means 6 adjusts a number of data N to a number M, such an adjustment can be carried out on the basis of addresses in a memory space of data storing means 5 having sampled data stored therein. Thus, such an adjusting can be performed without executing any arithmetic operations for newly selecting and deleting data samples. For this reason, the number of data can be efficiently adjusted without executing such arithmetic operations, and hence arithmetic operations for a fast Fourier transform (FFT) can be more efficiently executed.

Furthermore, in an observation apparatus of Embodiment 3, because data number adjusting means 6 can thin out data from, or insert data into, sampled data stored in data storing means 5 to thereby adjust a number of sample data, the number of data can be reliably and efficiently adjusted irrespective of size of data number N.

Furthermore, an observation apparatus according to Embodiment 3 can thin out data or insert data when adjusting a data sample number, allowing for a more optimized result. For example, when an initial data sample number N=31, a thinning out operation would thin out 15 data samples to arrive at an adjusted sample number of 16 ($2^4$) (i.e., the maximum number that is a power of two which does not exceed N). However, a data insertion operation would insert a single data sample to arrive at an adjusted sample number of 32 ($2^5$) (e.g., the minimum number that is a power of two which exceeds N). According to Embodiment 3, the thinning out process would not be selected. Thus, the selection of the insertion method over the thinning out method results in the processing of a smaller data quantity (e.g., 1 data sample vs. 15 data samples).

In this way, in an observation apparatus according to Embodiment 3, a number of times a data sample is thinned out can be compared to the number of times a data sample is inserted in order to select the smaller of the two. Thus, the quantity of data to be processed according to the adjustment operation can be efficiently adjusted.

Moreover, by minimizing the quantity of data samples in a data sample adjustment operation, it can be possible to suppress errors that could occur between a Fourier transform performed on original data sample and a Fourier transform performed on adjusted sample data. For this reason, the number of times sample data is thinned out is compared to the number of times sample data is inserted, to thereby select the smaller value. Consequently, the results of a Fourier transform performed on the adjusted sample data can be close to that of a Fourier transform performed on data prior to such an adjustment.

Embodiment 4 of the Invention.

A fourth embodiment of the present invention (hereinafter Embodiment 4) will now be described. Embodiment 4 can include a failure inspection apparatus that can inspect an integrated circuit under measurement. Such a failure inspection apparatus can have an observation apparatus, like any of the embodiments described above, mounted thereto. Such a failure inspection apparatus can observe a frequency spectrum of a power supply current to inspect integrated circuits for failures.

Figure 11:
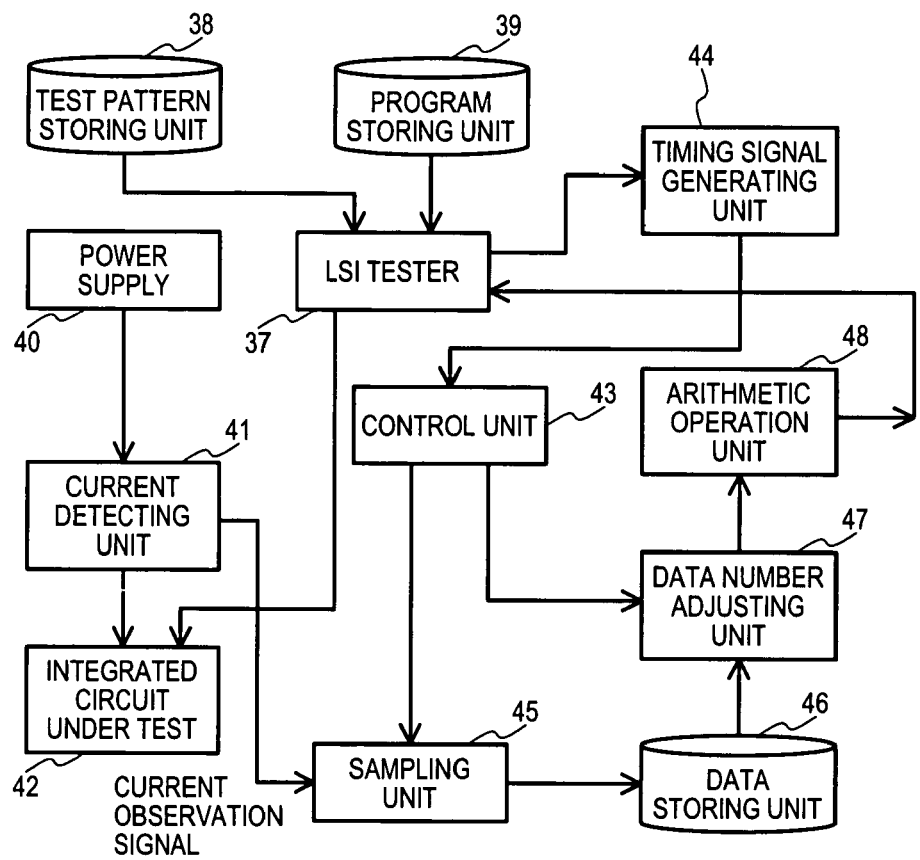
FIG. 11 is a block diagram showing one example of a failure detection apparatus according to a fourth embodiment (Embodiment 4) of the present invention.
Figure 12:
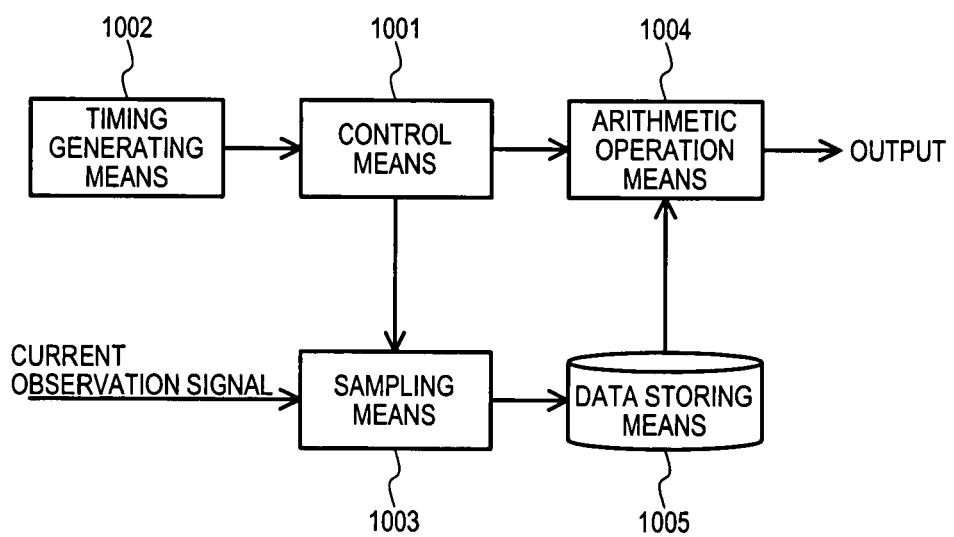
FIG. 12 is a block diagram showing a one example of a conventional observation apparatus.
Figure 13:
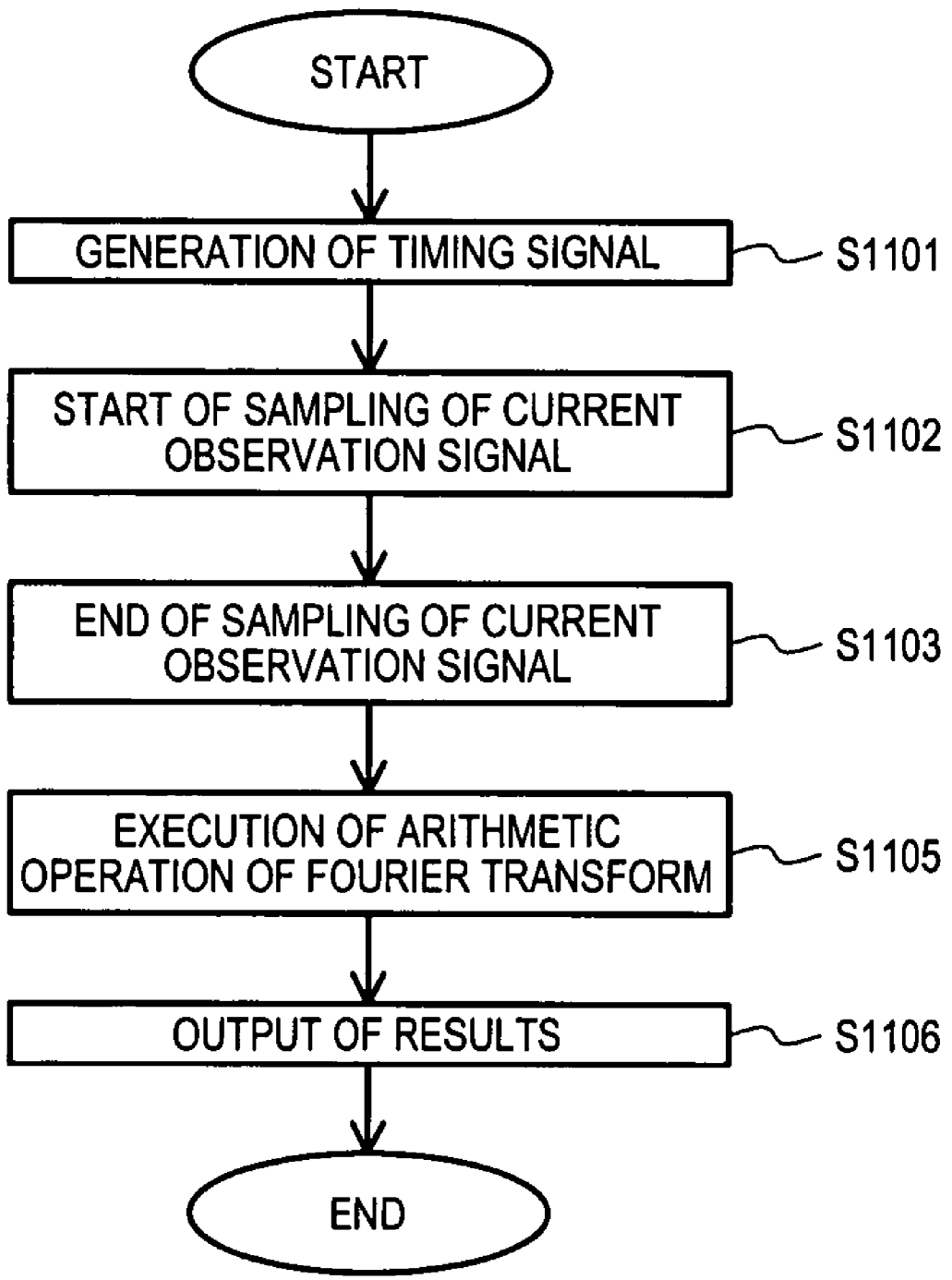
FIG. 13 is a flow diagram showing a processing flow according to a conventional observation apparatus.

First, a configuration of a failure inspection apparatus according to Embodiment 4 will be described with reference to FIG. 11. FIG. 11 is a block diagram showing one example of a failure inspection apparatus according to the present invention. As shown in FIG. 11, a failure inspection apparatus can include an LSI tester 37, a test pattern storing unit 38, a program storing unit 39, a power supply 40, a current detecting unit 41, and an observation apparatus of the present invention as main constituents.

An LSI tester 37 can be an apparatus, such as a computer, for applying a test signal used to carry out failure inspection for an integrated circuit 42 under examination. A test pattern storing unit 38 can be a unit in which information, such as test signal types and patterns, are stored. Such test signal types and patterns can be applied to an integrated circuit 42 under examination by an LSI tester 37. A program storing unit 39 can be a unit that stores information used to manipulate LSI tester 37 in order to generate test signals to be applied to integrated circuit 42 under examination by LSI tester 37. In addition, a test pattern storing unit 38 and program storing unit 39 can be connected to LSI tester 37. Also, an integrated circuit 42 under examination can be connected to LSI tester 37 so that test signals can be applied to the integrated circuit 42 under test by LSI tester 37.

A power supply 40 can supply a power supply current for integrated circuit 42 under examination. A current detecting unit 41 can be a unit that sends a power supply current from power supply unit 40 to integrated circuit 42 under examination. Also, current detection unit 41 can be a unit that observes a power supply current supplied to integrated circuit 42 under examination and sends information based on observation results, in the form of a current observation signal, to sampling unit 45.

As shown FIG. 11, an observation apparatus of Embodiment 4 can include a timing signal generating unit 44, a sampling unit 45, a data storing unit 46, a data number adjusting unit 47, an arithmetic operation unit 48, and a control unit 43 as main constituent elements.

A timing signal generating unit 44 can be a unit for generating a timing signal at a constant period. A sampling unit 45 can be a unit for carrying out data sampling for a current observation signal of the power supply current based on the timing signal of timing signal generating unit 44. Data storing unit 46 can be a unit that stores and holds sampling data sampled by sampling unit 45.

A data number adjusting unit 47 can be a unit for adjusting an arbitrary number of data stored in data storing unit 46 to a number that is a power of two. Thus, a fast Fourier transform (FFT) arithmetic operation can be performed on such data in accordance with an operation instruction issued by control unit 43. An arithmetic operation unit 48 can be a unit for executing the fast Fourier transform (FFT) to obtain specific frequency and the magnitude of higher harmonics of the frequency based on a number of sample data adjusted by data number adjusting unit 47. In addition, a control unit 43 can be a unit for managing the operation and control of the whole observation apparatus shown. Units of the observation apparatus of FIG. 11 can be connected in the same fashions as Embodiments 1 to 3.

Next, the operation of the failure inspection apparatus of Embodiment 4 will now be described. It is understood that an observation apparatus mounted to the failure inspection apparatus can operate in the same general fashion as any of Embodiments 1 to 3 to output arithmetic operation results from a current observation signal input.

An integrated circuit 42 under examination, and the object of a failure inspection, can be connected to current detecting unit 41 and supplied with a power supply current from power supply 40 by way of current detecting unit 41. Under this condition, integrated circuit 42 can be operated. In addition, test signals can be input from LSI tester 37 to integrated circuit 42 under examination.

LSI tester 37 can be operated in accordance with programs stored in program storing unit 39 to generate test signals. In addition, these test signals can be generated on the basis of a test pattern stored in test pattern storing unit 38.

A current detecting unit 41 can supply a power supply current to the integrated circuit 42 under examination. In addition, current detecting unit 41 can observe the power supply current supplied to the integrated circuit 42 under examination. Then, a current detecting unit 41 can provide a detected current to a sampling unit 45 as a current observation signal.

The timing signal generating unit 44 of the observation apparatus can be connected to LSI tester 37, and can receive as an input, information related to the application of test signals applied to the integrated circuit 42 under examination to generate the timing signal. Control unit 43 can be connected to timing signal generating unit 44 and receive as an input the timing signal to generate start and end indications for a signal sampling operation. Sampling unit 45 can start and end sampling operations according to such start and end indications. Once given a start indication, a sampling unit 45 can sample the current observation signal input from current detecting unit 41 until the reception of an end indication.

Data sampled by sampling unit 45 can be input into data storing unit 46 for storage. Then, control unit 43 can supply an operation instruction to data number adjusting unit 47 directing how data in data storing unit 46 is to be adjusted. In addition, as shown in the above-mentioned Embodiments 1 through 3, data number adjusting unit 47 can thin out data from, or insert data into the sampled data to thereby adjust the number of sample data. Here, a resulting number of adjusted sample data can be adjusted to be a power of two, in a manner similar to any of those shown in Embodiments 1 through 3.

When the number of sample data in data storing unit 46 has been adjusted by data number adjusting unit 47, control unit 43 can input an arithmetic operation instruction to arithmetic operation unit 48. In response to such an arithmetic operation instruction, arithmetic operation unit 48 can read out sample data stored in data storing unit 46 in accordance with adjustments by data number adjusting unit 47. Then, arithmetic operation unit 48, in a similar fashion to any of Embodiments 1 through 3, can execute the arithmetic operation of the fast Fourier transform (FFT) using adjusted sample data read out in accordance to the arithmetic operation instruction issued from the control unit 43.

Arithmetic operation unit 48 can output the results of the above arithmetic operation to a display portion, such as a monitor of a corresponding failure inspection apparatus. In addition, arithmetic operation unit 48 can be connected to LSI tester 37 and can output results of the arithmetic operation to the LSI tester 37. From arithmetic operation results input from arithmetic operation unit 48, LSI tester 37 can judge whether a failure is present or absent in integrated circuit 42 under examination.

An LSI tester 37 can judge whether a failure is present or absent in an integrated circuit 42 under examination by comparing arithmetic operation results from arithmetic operation unit 48 to results for a case where an integrated circuit under examination operates in a normal fashion. For example, the frequency spectrum of an integrated circuit operating in a normal fashion can be previously stored as a test pattern in test pattern storing unit 38, and such a frequency spectrum can be compared to that output from an arithmetic operation unit 48 generated by an integrated circuit 42 under examination. Such a comparison can detect when the frequency spectrum of an abnormal power supply current exists, thus enabling the LSI tester 37 to detect a failure.

As described above, a failure inspection apparatus according to an Embodiment 4 can have an observation apparatus of any of Embodiments 1 to 3 mounted thereto. In addition, the observation apparatus can execute the arithmetic operation of a Fourier transform operation efficiently, irrespective of an overall sampling (acquisition) time (dictated by a timing signal of timing signal generating unit 44) or sampling rate time. As a result, the observation apparatus can efficiently generate output results to thereby enable efficient generation of inspection results.

Moreover, in an observation apparatus mounted to the failure inspection apparatus of Embodiment 4, because a number of data samples is adjusted to a power of two, the arithmetic operation of the Fourier transform can be executed at a high speed with the fast Fourier transform (FFT). As a result, in a failure inspection apparatus according to Embodiment 4, the number of arithmetic operations can be greatly reduced with the fast Fourier transform (FFT) as compared to approaches using the discrete Fourier transform (DFT), hence inspection results can be generated at a faster speed. Accordingly, the arithmetic operation executed at a high speed with the fast Fourier transform (FFT) can make it possible to realize a failure inspection apparatus with high speed and efficient observation of the frequency spectrum of a power supply current.

In addition, in the observation apparatus of the failure inspection apparatus of Embodiment 4, when a data number adjusting unit 47 adjusts a number of data, such an adjustment can be carried out on the basis of addresses in a memory space of data storing unit 46 having sampled data stored therein. Such an adjusting can be performed without executing any arithmetic operations for newly selecting and deleting data samples or newly generating data. For this reason, the number of data can be efficiently adjusted without executing such arithmetic operations, and it can be possible to obtain a more efficient and high speed failure inspection using the observation of the frequency spectrum of the power supply circuit.

It is noted that while the various embodiments of the present invention have described arrangements in which a number of data samples can be adjusted to be a power of two, a data sample number may be adjusted to be a power of an integral number other than two. In addition, while various embodiments have described arrangements that can utilize a Cooley-Tukey type fast Fourier transform as the fast Fourier transform, other fast Fourier transforms may be used, such as the Prime Factor type fast Fourier transform. Moreover, in the case of the Cooley-Tukey type fast Fourier transform, an arithmetic operation can be the split-radix fast Fourier transform based on a plurality of integral numbers. In addition, in the case of a Prime Factor type fast Fourier transform, an adjustment of a sample data number can be carried out to so that a sampling data number is broken up in factors of every desired integral number. In this way, a data sample number can be adjusted on the basis of various types of fast Fourier transform calculation, thus a Fourier transform operation can be executed at a fast speed according to various possible fast Fourier transform operations. Consequently, it can be possible to observe the frequency spectrum of a power supply current faster and more efficiently than conventional approaches.

Moreover, while the various embodiments disclosed have shown the generation of a power supply current frequency spectrum according to a Fourier transform, the present invention should not be construed as being limited such approaches. The present invention may be utilized in conjunction with alternate signal transforms, including but not limited to the Hartley transform and "Wavelet" transform. Consequently, it can be possible to observe the frequency spectrum of a power supply current faster and more efficiently with transforms operations other than a Fourier transform.

According to the present invention, it can be possible to provide an observation apparatus and an observation method that are capable of efficiently observing a frequency spectrum of a power supply current. Further, it can be possible to provide a failure detection apparatus and failure detection method capable of detecting failures in an integrated circuit under observation. Still further, according to the present invention it can be possible to provide a program for realizing the above apparatuses and method on a computer, or the like.

In addition, one skilled in the art would recognize that various transforms can include a number of processing operations. In one approach, such processing operations can include a first arithmetic processing operation and a second arithmetic processing operation. A first arithmetic processing operation can calculate data sets based on decomposed terms. For example, assuming a particular Cooley-Tukey type fast Fourier transform for an adjusted data number of eight (e.g., eight samples), a first arithmetic processing operation may arrive at sets of decomposed frequency terms $F_3$, $F_4$, $F_5$, $F_6$ and $F_1$, $F_2$ for a frequency spectrum result F. A second arithmetic processing operation can operate on sampled data (f(0), f(1) to f(7)) on the basis of the decomposed terms to arrive at frequency spectrum terms F(0), F(1) to F(7). Of course, this is but one possible arrangement for one particular fast Fourier approach.

Finally, it is understood that while the various embodiments set forth herein have been described in detail, the present invention could be subject to various changes, substitutions, and alterations without departing from the spirit and scope of the invention. Accordingly, the present invention is intended to be limited only as defined by the appended claims.

What is claimed is:

1. An observation apparatus, comprising:
   a sampling unit that samples a current observation signal that corresponds to a power supply current;
   a data storing unit that stores a number of data samples sampled by the sampling unit;
   a data number adjusting unit that adjusts the number of data samples sampled by the sampling unit;
   a control unit for controlling the data number adjusting unit to adjust the number of data samples to an adjusted number that is a power of a predetermined integer if the number of data samples is not a power of the predetermined integer; and
   at least one arithmetic operation unit for performing arithmetic operations on the adjusted number of data samples to generate frequency spectrum data corresponding to the adjusted number of data samples.

2. The observation apparatus of claim 1, wherein:
   the at least one arithmetic operation unit generates decomposed frequency spectrum terms and performing repeated arithmetic operations on the adjusted number of data samples according to sets, each set having a predetermined number of values.

3. The observation apparatus of claim 2, wherein:
   the at least one arithmetic operation unit executes
      first arithmetic operation processing that calculates data set values after decomposing frequency spectrum terms to serve as reference values for the sets, and
      second arithmetic operation processing that performs arithmetic operations on the adjusted number of data values based on data set values calculated by the first arithmetic operation processing.

4. The observation apparatus of claim 1, wherein:
   the data number adjusting unit adjusts the number of data samples according to an adjustment selected from the group consisting of: thinning out the number of data samples sampled by the sampling unit and inserting data into the data samples sampled by the sampling unit.

5. The observation apparatus of claim 4, wherein:
   the data number adjusting unit adjusts the number of data samples based on storage addresses of the data samples stored in the data storing unit.

6. The observation apparatus of claim 4, wherein:
   the data number adjusting unit selects between thinning out the number of data samples or inserting data into the data samples according to the number of data samples sampled by the sampling unit.

7. The observation apparatus of claim 1, wherein:
   the at least one arithmetic operation unit generates frequency spectrum data according to a fast Fourier transform operation, and
   the predetermined integer is two.

8. The observation apparatus of claim 1, further including:
the sampling unit is coupled to the current observation signal corresponding to an integrated circuit under test;
a tester unit that applies a test signal to the integrated circuit under test;
a frequency spectrum analyzing unit that analyzes the frequency spectrum data from the at least one arithmetic operation unit to determine the presence of a failure condition in the integrated circuit under test.

9. A method of observing the frequency spectrum of a power supply current observation signal of an integrated circuit under test, comprising the steps of:
sampling the power supply current observation signal;
storing the sampled data;
adjusting the number of sampled data to an adjusted number of sampled data that is a power of a predetermined integer greater than one, if the number of sampled data is not a power of the predetermined integer; and
arithmetically operating on the adjusted number of data samples to generate frequency spectrum data corresponding to the adjusted number of data samples.

10. The meted of claim 9, wherein:
the step of arithmetically operating on the adjusted number of data samples includes generating decomposed frequency spectrum terms and performing repeated arithmetic operations on the adjusted number of data samples according to sets, each set having a predetermined number of values.

11. The method of claim 10, wherein:
the step of operating on the adjusted number of data samples includes,
  a first arithmetic operation processing sub step that calculates data set values after decomposing frequency spectrum terms to serve as reference values for the sets, and
  a second arithmetic operation processing sub step that performs arithmetic operations on the on the adjusted number of data values based on data set values calculated by the first arithmetic operation processing sub step.

12. The method of claim 9, wherein:
the step of adjusting the number of data samples adjusts a number of data samples according to the adjustment method selected from the group consisting of: thinning out the number of data samples sampled by the sampling unit and inserting data into the data samples sampled by the sampling unit.

13. The method of claim 12, wherein:
the step of adjusting the number of data samples thins out the number of data samples or inserts data into the data samples based on storage addresses of the stored data samples.

14. The method of 12, wherein:
the step of adjusting the number of data samples selects between thinning out the number of data samples or inserting data into the data samples according to the number of data samples provided by sampling the power supply current observation signal.

15. The method of claim 9, wherein:
the step of arithmetically operating on the adjusted number of data samples includes a fast Fourier transform operation; and
the predetermined integer is two.

16. The method of claim 9, further including:
applying at least one test signal to the integrated circuit under test; and
analyzing the frequency spectrum data to determine the presence of a failure condition in the integrated circuit under test.

17. A computer program embodied on a machine readable media for observing a frequency spectrum of an observation signal that observes a power supply current flowing through an integrated circuit under observation, comprising:
sampling means for controlling the sampling of the observation signal;
storing means for storing a number of data samples sampled in response to the sample means;
data number adjusting means for adjusting the number of data samples to an adjusted number that is a power of a predetermined integer that is greater than one if the number of data samples is not a power of the predetermined integer; and
arithmetic operation means that performs arithmetic operations on the adjusted number of data samples to generate frequency spectrum data corresponding to the adjusted number of data samples.

18. The computer program of claim 17, wherein:
the arithmetic operation means generates decomposed frequency spectrum terms and performs repeated arithmetic operations on the adjusted number of data samples according to sets, each set having a predetermined number of values.

19. The computer program of claim 17, wherein:
the arithmetic operation means includes,
  a first arithmetic operation processing means that calculates data set values after decomposing frequency spectrum terms to serve as reference values for the sets, and
  a second arithmetic operation processing means that performs arithmetic operations on the on the adjusted number of data values based on data set values calculated by the first arithmetic processing means.

20. The computer program of claim 17, wherein:
the data number adjusting means select between thinning out the number of data samples and inserting data into the number of data samples according to predetermined criteria.

* * * * *